(12) United States Patent
Lin et al.

(10) Patent No.: US 12,085,841 B2
(45) Date of Patent: Sep. 10, 2024

(54) SECURITY CAMERA WITH ANGLED CABLE ATTACHMENT FOR INCREASED DOWNWARD-VIEWING ANGLE

(71) Applicant: Google LLC, Mountain View, CA (US)

(72) Inventors: Chi-Ming Lin, New Taipei (TW); Mark Benjamin Kraz, Santa Clara, CA (US); Kok Yen Cheng, San Jose, CA (US); Aditya Shailesh Ghadiali, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/027,339

(22) PCT Filed: Aug. 2, 2021

(86) PCT No.: PCT/US2021/044191
§ 371 (c)(1),
(2) Date: Mar. 20, 2023

(87) PCT Pub. No.: WO2022/066287
PCT Pub. Date: Mar. 31, 2022

(65) Prior Publication Data
US 2023/0384655 A1 Nov. 30, 2023

Related U.S. Application Data

(63) Continuation of application No. 17/028,456, filed on Sep. 22, 2020.

(51) Int. Cl.
*G03B 17/55* (2021.01)
*G08B 13/196* (2006.01)
(Continued)

(52) U.S. Cl.
CPC ....... *G03B 17/55* (2013.01); *G08B 13/19619* (2013.01); *H04N 23/52* (2023.01);
(Continued)

(58) Field of Classification Search
CPC .............. G03B 17/55; G08B 13/19619; G08B 13/1963; G08B 13/19632;
(Continued)

(56) References Cited

U.S. PATENT DOCUMENTS 5,403,782 A 4/1995 Dixon et al.
9,661,235 B2 5/2017 Petty et al.
(Continued)

FOREIGN PATENT DOCUMENTS

CN 103269414 8/2013
CN 106534809 3/2017
(Continued)

OTHER PUBLICATIONS

"Foreign Office Action", TW Application No. 110141071, Oct. 2, 2023, 9 pages.
(Continued)

*Primary Examiner* — Tong-Ho Kim
(74) *Attorney, Agent, or Firm* — Colby Nipper PLLC

(57) ABSTRACT

This document describes a security camera with an angled cable attachment for an increased downward viewing angle. The security camera is battery-powered and can be magnetically coupled to a mounting device and electrically connected to another device via a cable. The cable has a cable attachment that, when coupled to the security camera, is angled toward a front of the security camera. This cable angle enables an increased downward tilt angle of the security camera by reducing interference of the cable attachment with the mounting device when the security camera is tilted downward. The security camera also has exposed contacts on a printed circuit board that connect with pins on the cable attachment.

20 Claims, 20 Drawing Sheets

(51) Int. Cl.
*H04N 23/52* (2023.01)
*H05K 7/20* (2006.01)
*H04N 23/51* (2023.01)

(52) U.S. Cl.
CPC ..... *H05K 7/20472* (2013.01); *H05K 7/20509* (2013.01); *H04N 23/51* (2023.01); *H05K 7/20454* (2013.01)

(58) Field of Classification Search
CPC .. G08B 13/19617; H04N 23/52; H04N 23/51; H04N 23/54; H05K 7/20472; H05K 7/20509; H05K 7/20454
USPC .......................................................... 348/143
See application file for complete search history.

(56) References Cited

U.S. PATENT DOCUMENTS

| | | | |
|---|---|---|---|
| 10,062,249 | B1 | 8/2018 | Modi et al. |
| 10,319,213 | B1 | 6/2019 | Conner |
| 10,352,496 | B2 | 7/2019 | Mehdi et al. |
| 10,401,710 | B2 | 9/2019 | Wilson et al. |
| 10,418,672 | B2 | 9/2019 | Tso et al. |
| 10,708,472 | B2 | 7/2020 | Jeong et al. |
| 10,718,996 | B2 | 7/2020 | Ramones et al. |
| 10,795,242 | B2 | 10/2020 | Chan et al. |
| 11,277,941 | B1 | 3/2022 | Raghupathy et al. |
| 11,659,677 | B2 | 5/2023 | Kwan et al. |
| 11,852,957 | B2 | 12/2023 | Ali et al. |
| 2008/0143525 | A1 | 6/2008 | Woodbury et al. |
| 2011/0149533 | A1 | 6/2011 | Luo et al. |
| 2014/0160250 | A1 | 6/2014 | Pomerantz et al. |
| 2014/0253728 | A1 | 9/2014 | Glockler |
| 2015/0264162 | A1 | 9/2015 | Peng |
| 2016/0043453 | A1 | 2/2016 | Ebner et al. |
| 2016/0157333 | A1 | 6/2016 | Kim et al. |
| 2016/0189502 | A1 | 6/2016 | Johnson et al. |
| 2016/0191864 | A1 | 6/2016 | Siminoff et al. |
| 2017/0031235 | A1 | 2/2017 | Kubotera et al. |
| 2017/0339343 | A1 | 11/2017 | Zhang et al. |
| 2018/0011390 | A1 | 1/2018 | Goulden et al. |
| 2018/0013272 | A1* | 1/2018 | Germe ................ H02G 3/0437 |
| 2018/0143671 | A1 | 5/2018 | Lee et al. |
| 2018/0191930 | A1 | 7/2018 | Jeong et al. |
| 2019/0004401 | A1 | 1/2019 | Wilson et al. |
| 2019/0089872 | A1 | 3/2019 | Rukes et al. |
| 2019/0215423 | A1 | 7/2019 | Ortiz et al. |
| 2019/0230259 | A1 | 7/2019 | Germe et al. |
| 2019/0373314 | A1 | 12/2019 | Collins et al. |
| 2020/0201144 | A1 | 6/2020 | Ramones et al. |
| 2020/0241396 | A1 | 7/2020 | Park et al. |
| 2022/0091484 | A1 | 3/2022 | Ali et al. |
| 2022/0110228 | A1 | 4/2022 | Raghupathy et al. |
| 2022/0159877 | A1 | 5/2022 | Raghupathy et al. |
| 2022/0268860 | A1 | 8/2022 | Ghadiali et al. |
| 2022/0373870 | A1 | 11/2022 | Law et al. |
| 2023/0031426 | A1 | 2/2023 | Kraz et al. |
| 2024/0085766 | A1 | 3/2024 | Ali et al. |

FOREIGN PATENT DOCUMENTS

| | | |
|---|---|---|
| CN | 106791337 | 5/2017 |
| CN | 206629176 | 11/2017 |
| CN | 107995393 | 5/2018 |
| CN | 109862329 | 6/2019 |
| CN | 110891135 | 3/2020 |
| CN | 210958525 | 7/2020 |
| CN | 212463322 | 2/2021 |
| EP | 2043067 | 4/2009 |
| EP | 3557552 | 10/2019 |
| JP | 2002369047 A | 12/2002 |
| JP | 2010261801 | 11/2010 |
| JP | 2013065544 A | 4/2013 |
| JP | 5408890 | 2/2014 |
| JP | 2015195132 A | 11/2015 |
| KR | 20180019449 | 2/2018 |
| TW | 201044866 | 12/2010 |
| TW | T202115457 | 4/2021 |
| WO | 2013168391 A1 | 11/2013 |
| WO | 2014138776 | 9/2014 |
| WO | 2014201510 | 12/2014 |
| WO | 2021021918 | 2/2021 |
| WO | 2022066287 | 3/2022 |
| WO | 2023277933 | 1/2023 |

OTHER PUBLICATIONS

"Notice of Allowance", U.S. Appl. No. 17/028,456, Aug. 14, 2023, 10 pages.
"Ex Parte Quayle Action", U.S. Appl. No. 17/061,872, Sep. 16, 2021, 9 pages.
"Extended European Search Report", EP Application No. 21193113. 4, Feb. 4, 2022, 10 pages.
"Foreign Office Action", TW Application No. 110141071, Apr. 11, 2022, 7 pages.
"Foreign Office Action", TW Application No. 110141071, Sep. 7, 2022, 16 pages.
"International Preliminary Report on Patentability", Application No. PCT/US2021/044197, Jan. 31, 2023, 8 pages.
"International Preliminary Report on Patentability", Application No. PCT/US2020/044049, Feb. 1, 2022, 9 pages.
"International Search Report and Written Opinion", Application No. PCT/US2021/044197, Apr. 4, 2022, 11 pages.
"International Search Report and Written Opinion", Application No. PCT/US2020/044049, Nov. 19, 2020, 12 pages.
"International Search Report and Written Opinion", Application No. PCT/US2021/044194, Dec. 7, 2021, 12 pages.
"Notice of Allowance", U.S. Appl. No. 17/061,872, Dec. 13, 2021, 6 pages.
"Restriction Requirement", U.S. Appl. No. 17/028,456, Feb. 24, 2023, 6 pages.
Orsan, "What's Inside?—vol. 2: Dropcam Pro", https://medium.com/@candemir/whats-inside-vol-2-dropcam-pro-f458d96ecc9a, Dec. 21, 2014, 23 pages.
"Foreign Office Action", AU Application No. 2021349774, Dec. 5, 2023, 3 pages.
"International Preliminary Report on Patentability", Application No. PCT/US2021/044194, Mar. 28, 2023, 9 pages.
"Foreign Office Action", JP Application No. 2023-518271, May 7, 2024, 7 pages.
"Non-Final Office Action", U.S. Appl. No. 17/815,058, filed Apr. 3, 2024, 15 pages.
"Final Office Action", U.S. Appl. No. 17/815,058, filed Jul. 11, 2024, 16 pages.

* cited by examiner

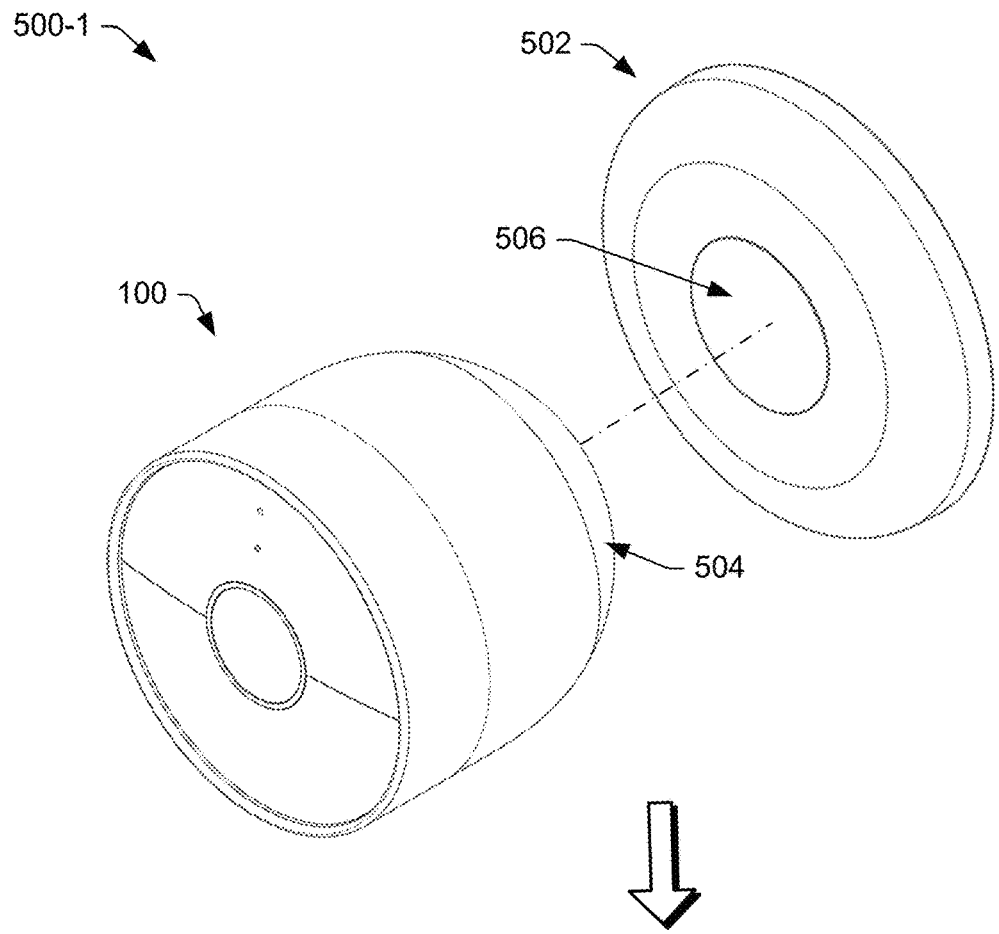
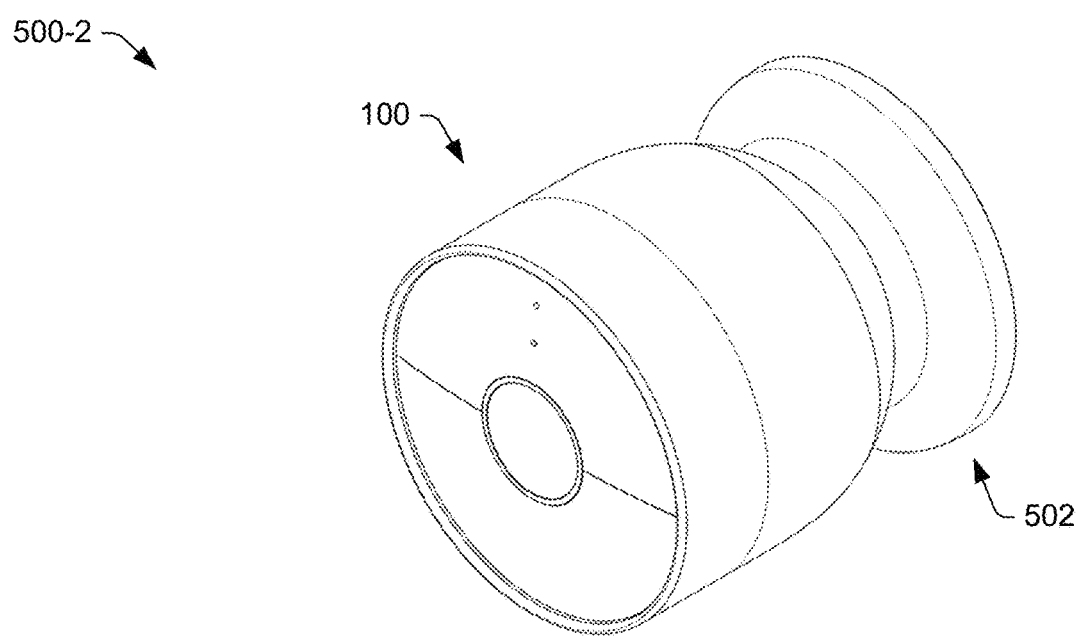
FIG. 5

Section 8-8

Section 17–17

Section 18-18

SECURITY CAMERA WITH ANGLED CABLE ATTACHMENT FOR INCREASED DOWNWARD-VIEWING ANGLE

RELATED APPLICATION(S)

This application is a national stage entry of International Application No. PCT/US2021/044194, filed Aug. 2, 2021, which claims priority to U.S. Application Ser. No. 17/028,456, filed Sep. 22, 2020, the disclosures of which are incorporated herein by reference in their entirety.

BACKGROUND

Security cameras are frequently installed at heights that are difficult for the many of people to reach, which reduces the likelihood that a person will tamper with the security camera. Due to such installment locations, security cameras are typically angled downward from horizontal to record images and/or video of a large area in front of and below the security camera. However, many security cameras have limited articulation due to an associated mounting structure used to affix the security camera to a surface (e.g., wall), a mechanical hinge connecting the security camera to the mounting structure, and/or an electrical cable connecting the security camera to a power source or another device. These limitations in the articulation of the security camera may limit the security camera's angle of view and consequently diminish the security camera's usefulness.

SUMMARY

This document describes a security camera with an angled cable attachment for an increased downward viewing angle. The security camera is battery-powered and can be magnetically coupled to a mounting device and electrically connected to another device via a cable. The cable has a cable attachment that, when coupled to the security camera, is angled toward a front of the security camera. This cable angle enables an increased downward tilt angle of the security camera by reducing interference of the cable attachment with the mounting device when the security camera is tilted downward. The security camera also has exposed contacts on a printed circuit board (PCB) that connect with pins on the cable attachment.

According to an aspect, a system is disclosed that comprises an electronic device and a coupler. The electronic device includes a housing, a front element, a camera module, a magnetizable member, and a recessed area. The housing has a generally cup-shaped shell and is generally symmetric about a central axis. The housing also has a front end defined by an opening of the shell and a rear end defined by a rounded cap of the shell. The front element is positioned at the front end of the housing and oriented to substantially cover the opening of the shell. The front element includes a lens cover. The camera module is disposed within the housing and aligned with the lens cover of the front element. The magnetizable member is positioned within the housing proximate to the rear end of the housing. Also, the magnetizable member is configured to magnetically couple the electronic device to a mounting device. The recessed area is located on a lateral side of the housing relative to longitudinal axis of the housing and includes a substantially planar surface and a plurality of contacts that are conductive and exposed through the substantially planar surface. The coupler has a contact surface configured to contact the substantially planar surface. The coupler is attached to a cable and configured to removably connect the cable to the electronic device via the recessed area. Also, the coupler is configured to define an acute angle between the cable and the contact surface. In addition, the coupler causes the cable to extend in a direction toward the front end of the housing to increase a downward tilt angle of the electronic device relative to the mounting device.

This summary is provided to introduce simplified concepts concerning a security camera with an angled cable attachment for an increased downward-viewing angle, which is further described below in the Detailed Description and Drawings. This summary is not intended to identify essential features of the claimed subject matter, nor is it intended for use in determining the scope of the claimed subject matter.

BRIEF DESCRIPTION OF THE DRAWINGS

The details of one or more aspects of a security camera with an angled cable attachment for an increased downward-viewing angle are described in this document with reference to the following drawings. The use of the same reference numbers in different instances in the description and the figures indicate similar elements:

FIG. 1-2 illustrates an exploded view of some components of the electronic device in FIG. 1;

FIG. 2 illustrates a front elevational view of the electronic device in FIG. 1;

FIG. 5 illustrates an example implementation of the electronic device in FIG. 1 being coupled to a mounting device;

DETAILED DESCRIPTION

Overview

This document describes a security camera with an angled cable attachment for an increased downward-viewing angle. The techniques described herein provide a compact, battery-powered security camera that can be magnetically coupled to a mounting device. The security camera has a cable attachment that is angled toward a front of the security camera to reduce interference by the cable attachment with the mounting device and enable a downward tilt angle of the security camera to be increased. This increased downward tilt angle enables the security camera to have a downward viewing angle sufficient to view the ground proximate to the wall upon which the mounting device is affixed, regardless of a height at which the security camera (and the mounting device) is installed. In this way, the maximum downward viewing angle does not significantly change based on the height of the security camera. For instance, regardless of whether the security camera is installed at six feet (1.829 meters) or 16 feet (4.877 meters), the security camera can capture an image of a package located on the ground below the security camera.

The cable attachment connects to the security camera via a port. The port is a recessed area providing access to multiple corrosion-resistant contacts (e.g., gold) that are part of a PCB located inside the security camera. These contacts are exposed to air and are implemented to reduce the distance between pins (e.g., pogo pins) on the cable attachment and the PCB in the security camera, which also reduces losses due to resistances of the signal mediums. Some of the contacts may be used for USB negotiation and some of the contacts may be used for device detection.

While features and concepts of the described security camera with an angled cable attachment for an increased downward-viewing angle can be implemented in any number of different environments, aspects are described in the context of the following examples.

Example Device

Figure 1:
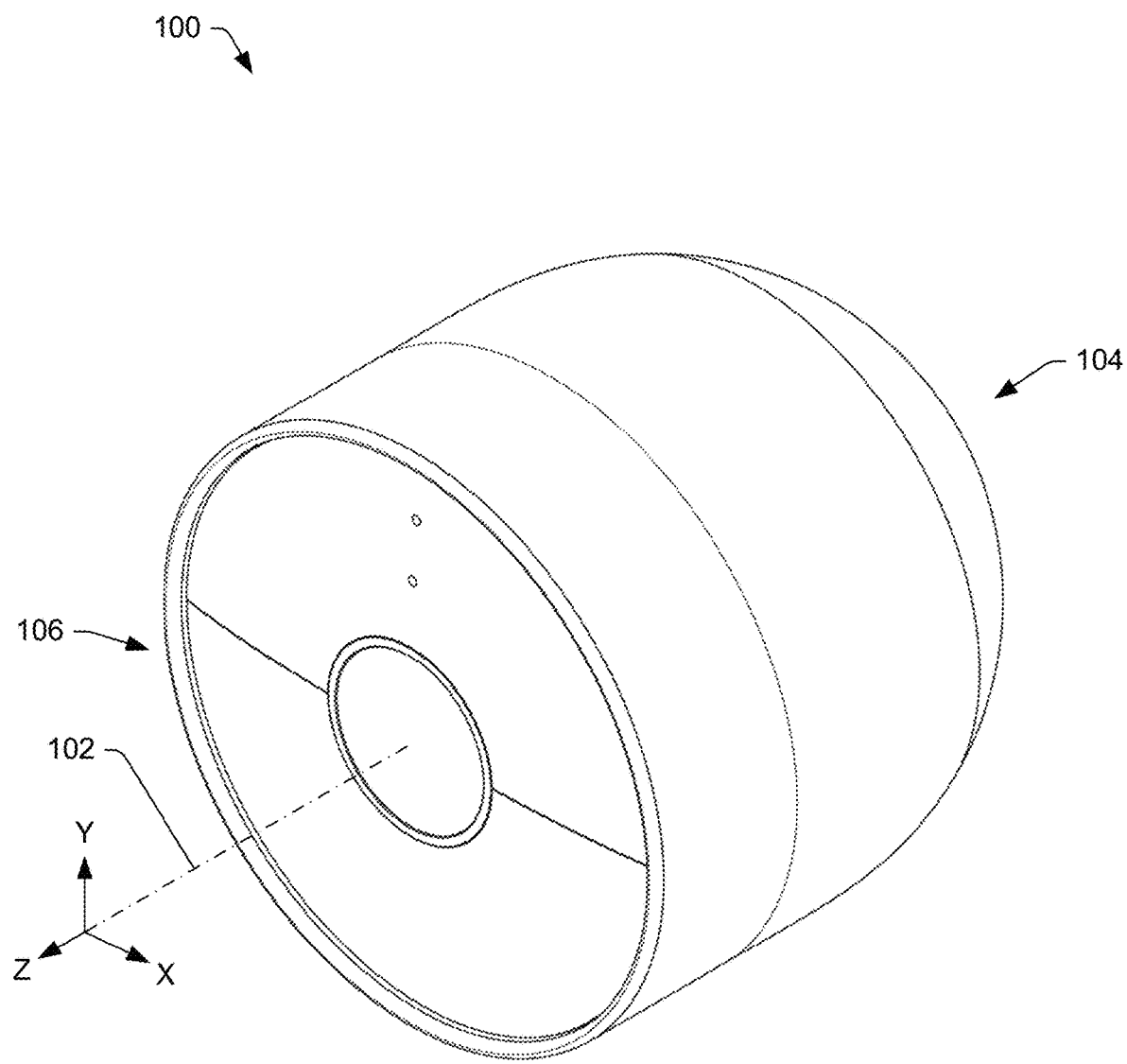
FIG. 1-1 illustrates an example electronic device in accordance with one or more implementations.

FIG. 1-1 illustrates an example electronic device 100 in accordance with one or more implementations. In aspects, the electronic device 100 is a camera device (e.g., security camera) that is battery-operated and usable in either an indoor or an outdoor environment. The electronic device 100 includes an elongated shape having a longitudinal axis 102. In aspects, the electronic device 100 is generally symmetrical about the longitudinal axis 102. The electronic device 100 may have a cross section, which is orthogonal to the longitudinal axis 102, having any suitable shape, including an elliptical shape, a circular shape, a triangular shape, a rectangular shape, a hexagonal shape, and so on. Further, the electronic device 100 has first and second opposing ends 104 and 106, respectively, that are intersected by the longitudinal axis 102. The first end 104 may be rounded, forming a convexly curved exterior surface. The second end 106 may be substantially planar and orthogonal to the longitudinal axis 102. For convenience, the electronic device 100 is described herein with respect to xyz directions as illustrated in FIG. 1-1. For example, the longitudinal axis 102 is described as being parallel to a z-axis and first and second ends 104 and 106 are separated by a distance along the longitudinal axis 102. Further, lateral sides of the electronic device 100 refer to sides that are intersected by a plane defined by an x-axis and a y-axis, such as an xy-plane.

Figures 1, 2:
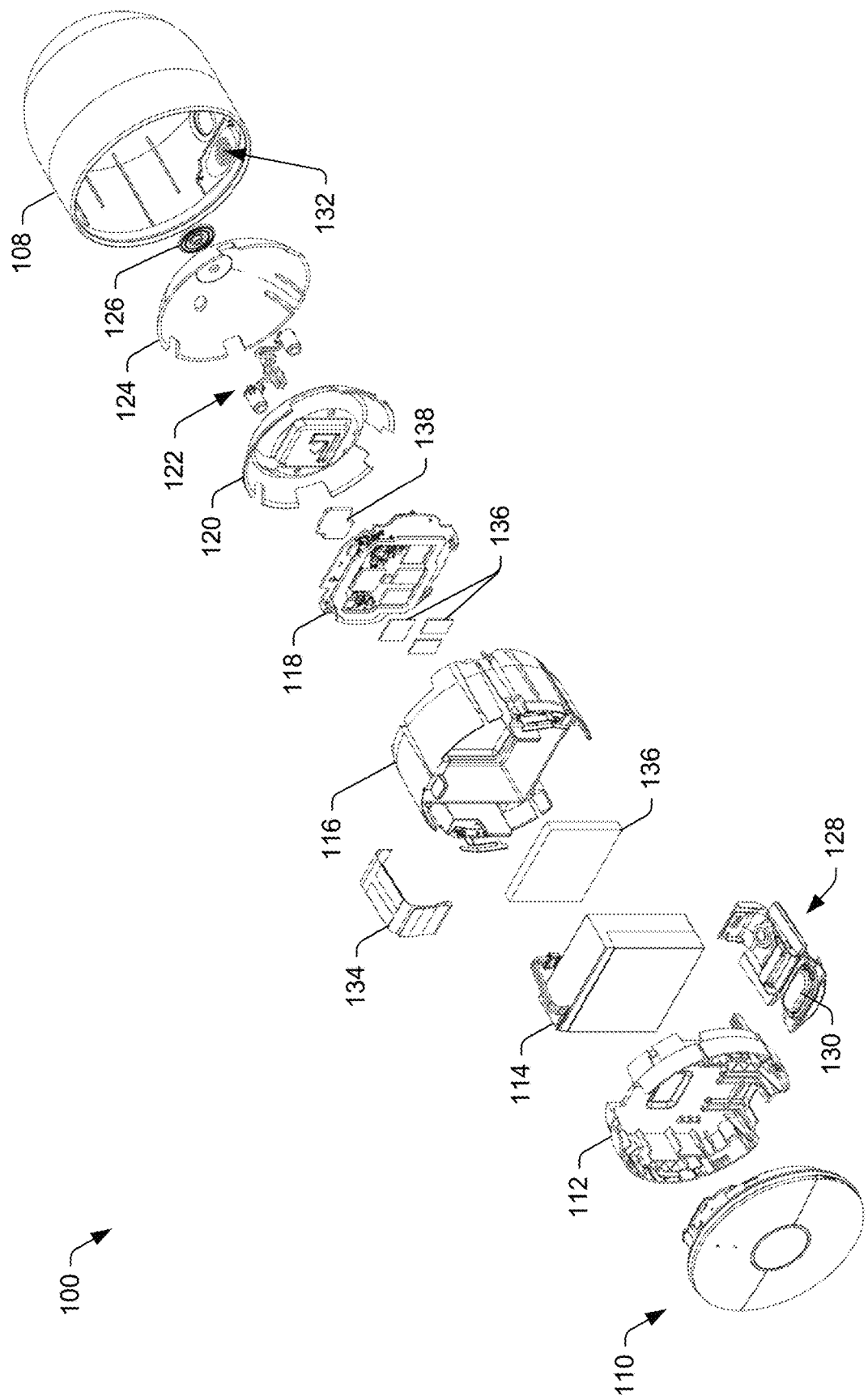
Figure 2:
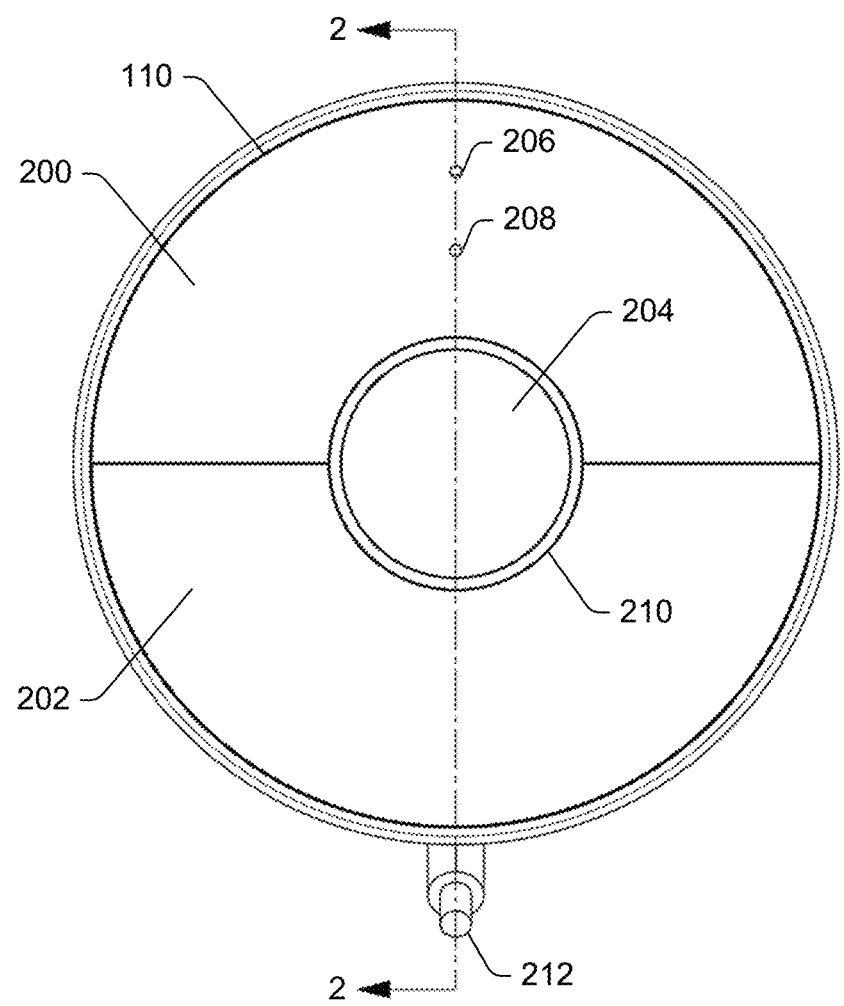

FIG. 1-2 illustrates an exploded view of some components of the electronic device in FIG. 1. The electronic device 100 includes a housing 108 and a front element 110 that, when assembled together, define an interior space that houses various components of the electronic device 100. The housing 108 forms a cup-shaped shell that is generally symmetric about a central axis (e.g., longitudinal axis 102 in FIG. 1-1). The shell includes an open end and a closed, rounded end (e.g., the first end 104 of the electronic device 100). The front element 110 has a general disk-like shape and is configured to be assembled to the housing 108 at the open end of the shell.

The electronic device 100 includes a midframe 112, a battery 114, a front chassis 116, a main logic board (MLB) 118, a magnet shield 120, a plunger subassembly 122, a rear chassis 124, a button 126, a connector subassembly 128, and a speaker module 130. In aspects, the speaker module 130, when assembled, is aligned with perforations 132 located on a lateral side of the housing 108. The front element 110 may include a camera module for capturing images and/or video, a passive infrared (PIR) sensor for detecting motion, and one or more IR illuminators for providing IR light used for motion detection by the PIR sensor. Further, a flexible printed circuit (FPC) 134 is included to electrically and directly connect the PIR sensor and the camera module on the front element 110 to the MLB 118.

The front element 110 attaches to the midframe 112 via a twist lock mechanism. For example, the front element 110 snaps onto the midframe 112 and twists off the midframe 112. In this way, the front element 110 does not necessarily attach directly to the housing 108.

The midframe 112, the battery 114, and the front chassis 116 together may form a front chassis subassembly. The front chassis subassembly may also include a thermal foam 136 disposed between the battery 114 and the front chassis 116. When assembled, the battery 114 hangs cantilevered to the midframe 112 via adhesive and the midframe is connected to the front chassis 116 with the battery 114 between the midframe 112 and the front chassis 116. The front chassis 116 includes a metallic material (e.g. magnesium) and is configured to act as a heatsink to conduct heat away from the battery 114 and the MLB 118 as well as to protect the battery 114. A thermal foam 136 is disposed inside the front chassis subassembly between the battery 114 and the front chassis 116. The thermal foam 136 is flexible (e.g., compressible), which enables the battery 114 to expand and contract due to heat. Also, the thermal foam 136 is configured to prevent the battery from contacting a hard surface (e.g., the front chassis 116) as the battery 114 expands or as the electronic device 100 experiences an impact force (e.g., falls to the ground).

The electronic device 100 also includes various thermal interface materials (TIMs), including TIMs 136 and 138 for thermal management. For example, the TIMs may be disposed proximate to heat dissipating components mounted on the MLB (e.g., system-on-chip (SoC) or other integrated circuit devices).

The rear chassis 124 includes a metallic material (e.g., magnesium) and may be used as a heatsink to conduct heat toward the housing 108. The rear chassis 124 is a magnetizable member and may be used for magnetic mounting. For example, the rear chassis 124 is positioned within the housing 108 proximate to the rounded end (e.g., the second end 106 of the electronic device 100) of the housing 108. When the electronic device 100 is magnetically coupled to a mounting device, the rear chassis 124 is attracted to the magnet in the mounting device and the magnetic force retains a portion of the convexly curved exterior surface of the rounded end against the mounting device. Further details of this are described below.

The magnet shield 120 shields the MLB 118 from the magnetic force acting on the rear chassis 124 by the magnetic mounting device. The plunger subassembly 122 is disposed between the magnet shield and the rear chassis 124 to enable a user to press the button 126, which is accessible via a center point of the rounded end of the housing 108, to trigger a function performed by the MLB 118. For example, the plunger subassembly 122 translates the user input (pressing force) from a plane of the button 126 to a plane of the MLB 118 (e.g., the plunger subassembly 122 presses onto a center button on the MLB 118 when the user presses onto the button 126.

FIG. 2 illustrates a front elevational view of the electronic device in FIG. 1. The front element 110 is illustrated as having a first portion 200 (e.g., upper portion), a second portion 202 (lower portion), and a third portion 204 (e.g., lens cover) surrounded by the first and second portions 200 and 202. The first and second portions 200 and 202 together form a ring shape with the third portion 204 concentrically positioned in the middle of the ring shape.

In implementations, the first portion 200 may be a polycarbonate with a specific color blend (e.g., black, gray, blue). The first portion 200 is IR transparent and is positioned in front of IR illuminators (e.g., IR LEDs), which may be used for night vision. Any suitable number of IR illuminators may be implemented, including 1, 2, 3, 4, and so forth. In the examples described herein, the electronic device 100 includes six IR LEDs disposed behind the first portion 200. The first portion 200 also defines a microphone hole (e.g., hole 206) aligned with an audio sensor disposed within the housing 108 behind the first portion 200. In addition, a status LED 208 may be disposed within the first portion 200 (e.g., as part of the first portion 200 or positioned within a hole defined by the first portion) and configured to provide light in patterns and/or colors corresponding to an operating status of the electronic device 100.

The second portion 202 is also IR transparent and is disposed in front of the PIR sensor. In aspects, the second portion 202 may include any suitable IR-transparent material, including high-density polyethylene (HDPE). Also, the second portion 202 may include a lens pattern (e.g., Fresnel lens) on the backside of the second portion 202, which is usable by the PIR sensor. The third portion 204 is transparent to visible light and is aligned with the camera module to enable the camera module to capture images and/or video of a scene. In aspects, the front element 110 may include a fourth portion 210, which is IR opaque and surrounds a perimeter of the third portion 204 to block IR flare (e.g., IR light traveling through the first portion 200 from entering a camera lens of the camera module via the third portion 204). Also illustrated in FIG. 2 is a cable 212 connected to the electronic device 100, which may be configured to transmit signals between the electronic device 100 and an additional electronic device (e.g., accessory device, power source).

In some aspects, one or both of the first and second portions 200 and 202 of the front element 110 may include a tapering thickness (e.g., front-to-back thickness). For example, the second portion may have a greater thickness (e.g., within a range of 0.64 millimeters (mm) to 0.7 mm) toward the left and right sides of the illustration and a lesser thickness (e.g., within a range of 0.55 mm to 0.63 mm) in a middle region (e.g., proximate to the dashed line) that is aligned with the PIR sensor.

Figure 3:
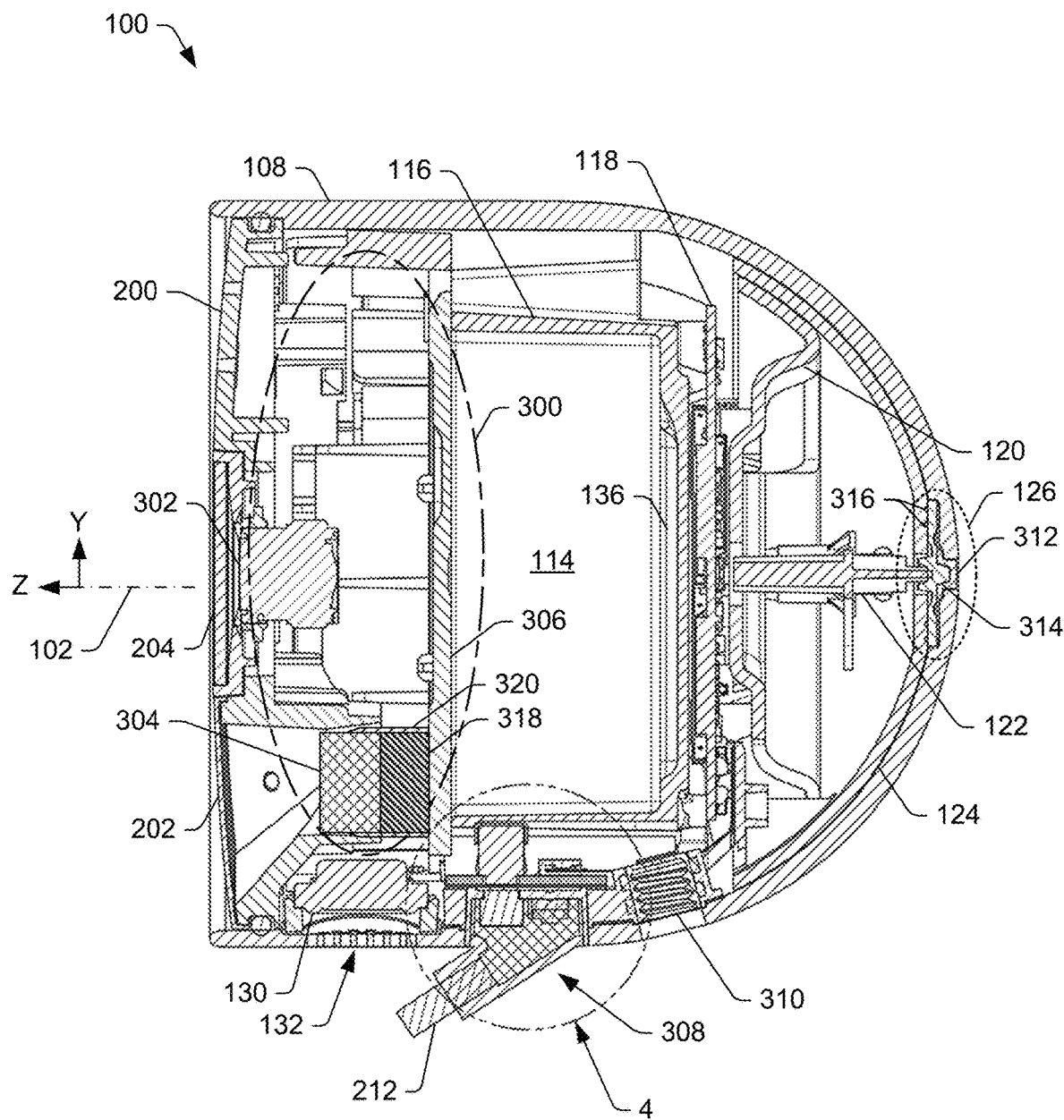
FIG. 3 illustrates a sectional view of the electronic device in FIG. 2, taken along line 3-3.

FIG. 3 illustrates a sectional view of the electronic device in FIG. 2, taken along line 3-3. In the illustrated example, the electronic device 100 is shown in an assembled state. A camera module (e.g., camera module 300) includes a camera lens 302 that is aligned (e.g., coaxial) with the longitudinal axis 102 of the electronic device 100. In this way, the camera lens 302 is centered within the housing 108 of the electronic device 100. Further, the camera lens 302 is aligned with the third portion 204 of the front element 110. The camera module 300 also includes a PIR sensor 304, which is aligned with the second portion 202 of the front element 110. Further, the camera module 300 includes a PCB (e.g., camera board 306) with one or more integrated circuits and sensors, including an image sensor for recording images of scenes captured through the camera lens 302.

As described above, the battery 114 is positioned between the midframe 112 and the front chassis 116. Further, the battery 114 is protected by the thermal foam 136 from contacting the hard surfaces of the front chassis 116. On one lateral side of the housing 108 (e.g., bottom side in the illustration), the housing 108 includes perforations 132 that enable audio waves to pass through from the speaker module 130 to the environment surrounding the electronic device 100. Proximate to the perforations 132, the housing 108 includes a recessed area configured to receive a connecting mechanism of a cable (e.g., the cable 212). The connecting mechanism may be a coupler 308, which is described in further detail in relation to FIG. 4. The recessed area is located between the perforations 132 and a threaded insert 310, which is configured to connect with a mounting structure (e.g., a tripod, a tabletop stand).

Also illustrated is the plunger subassembly 122 disposed between the rear chassis 124 and the magnet shield 120. The plunger subassembly 122 is axially aligned with the button 126. The button 126 is formed via a two-shot molding technique, which chemically bonds together two different materials. An outer portion 312 of the button 126 is a rigid material (e.g., hard plastic) and may substantially match the material of the housing 108. An inner portion 314 of the button 126 is a flexible material (e.g., silicon, thermoplastic elastomer (TPE), thermoplastic polyurethane (TPU)) and is adhered to the housing 108 to create a seal against water ingress. The inner portion 314 includes one or more ribs 316 that abut an outer surface of the rear chassis 124 and help maintain the water seal when a user presses against the outer portion 312 of the button 126. In this example, the rear chassis 124 includes a substantially planar area on its outer surface, which is configured to receive the button 126. This planar area provides structural support for the button 126, particularly when the button 126 is pressed by the user. Also, the diameter of the button 126 is significantly greater than a diameter of the hole in the rear chassis 124 to prevent the button 126 from overtraveling and damaging the water seal when the button 126 is pressed by the user.

In aspects, the PIR sensor 304 includes a standoff 318, which may be any suitable material, including a high-temperature nylon material. The standoff 318 is used to define a sensor-to-lens distance between the PIR sensor and a lens (e.g., Fresnel lens) implemented on the second portion 202 of the front element 110. Using the standoff 318, the PIR sensor 304 is mounted directly to the camera board 306. In this way, both the PIR sensor 304 and the image sensor of the camera module 300 are mounted on the same PCB (e.g., the camera board 306). One challenge that arises when implementing the standoff 318 is noise caused by leads of the PIR sensor 304 acting as antennas and capturing stray electromagnetic interference (EMI) or other radiation. To prevent noise, a PIR shield 320 is disposed around the base of the PIR sensor 304, its leads, and the standoff 318. In aspects, the PIR shield 320 has a tubular shape (e.g., cylinder) and includes a metal material (e.g., copper nickel) with plating. However, the PIR shield 320 may have any suitable cross-sectional shape that corresponds to a cross-sectional shape of the PIR sensor 304. The PIR shield 320 contacts the sidewalls of the PIR sensor 304 and is mounted (e.g., soldered) to the camera board 306. In this way, the PIR shield 320 covers the leads of the PIR sensor 304 and grounds the sidewalls of the PIR sensor 304 to the camera board 306. Additional grounding and shielding may be added in the form of a conductive adhesive positioned on the backside of the PIR sensor 304 (e.g., between the PIR sensor 304 and the standoff 318). Grounding and shielding the PIR sensor 304 in this manner significantly reduces the effects of noise on the performance of the PIR sensor 304.

Another challenge with mounting the PIR sensor 304 and the image sensor of the camera module 300 to the same PCB is thermal management. To prevent heat from the image sensor from reaching the PIR sensor 304, the camera board 306 includes a cutout between the sensors. The cutout may be elongated in a direction that is substantially orthogonal to a line connecting the PIR sensor 304 and the image sensor. Accordingly, the cutout slows changes in a temperature gradient of the camera board 306 that are caused by heat generated by the image sensor, which helps protect the PIR sensor 304 from rapid changes in the temperature gradient of the camera board 306.

Figure 4:
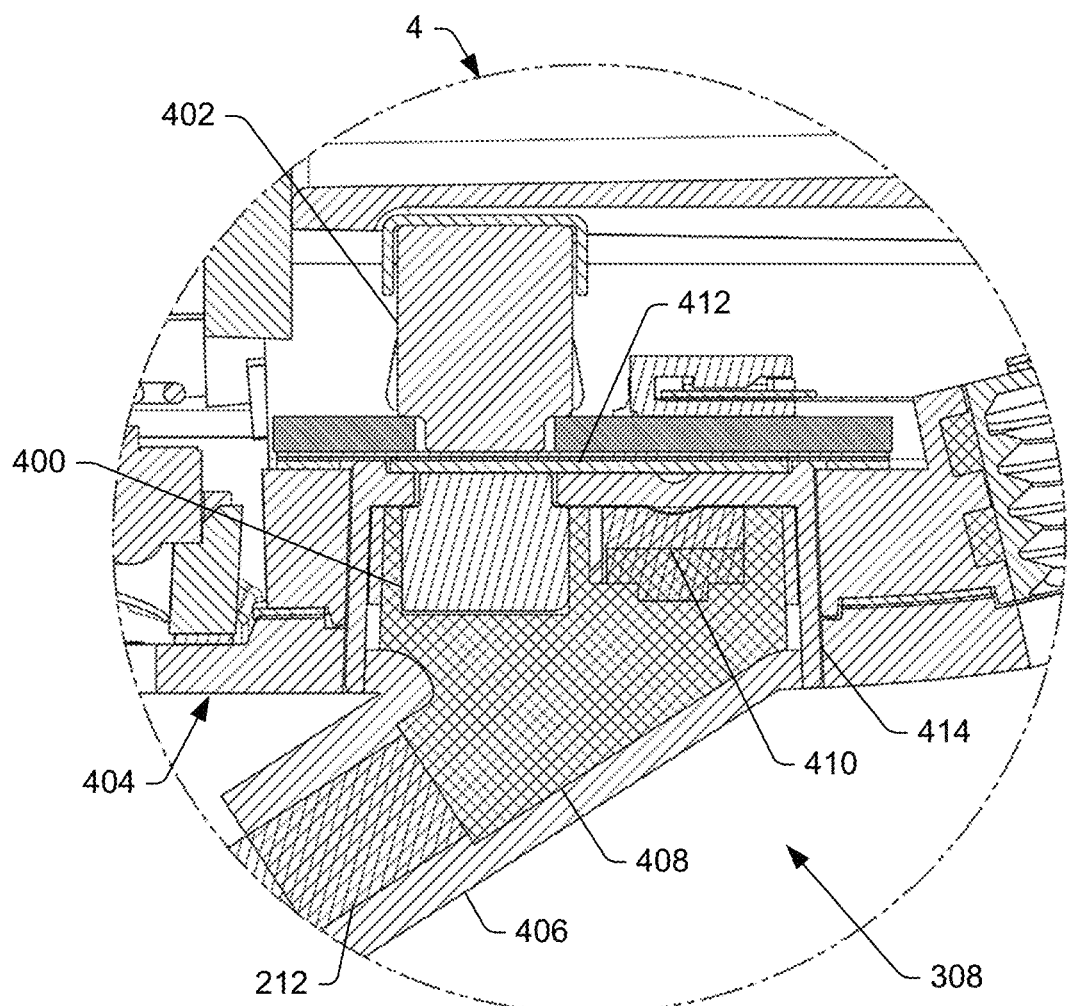
FIG. 4 illustrates an enlarged view of a portion of the sectional view of the electronic device in FIG. 3 that shows a cable attachment coupled to the electronic device.

Continuing, FIG. 4 illustrates an enlarged view of a portion of the sectional view of the electronic device in FIG. 3 that shows a cable attachment coupled to the electronic device. The enlarged view shows a portion of the connector subassembly 128 from FIG. 1-2 and the coupler 308. The coupler 308 is retained in the recessed area of the housing 108 by one or more magnets. For example, one or both of the coupler 308 and the electronic device 100 may include a magnet. In the illustrated example, the coupler 308 includes a coupler magnet 400 and the electronic device 100 includes a connector magnet 402. These magnets 400 and 402 are aligned to provide sufficient magnetic force to maintain an electrical connection between pins on the coupler 308 and electrical contacts on the electronic device 100. When assembled to the electronic device 100, the coupler 308 defines an acute angle between the cable 212 and a lateral-side exterior surface 404 of the housing 108. The acute angle is defined by an overmold 406, which provides strain relief. The coupler 308 also includes an undermold 408, which provides strain relief and also holds the coupler magnet 400, wires of the cable 212, and pins (e.g., pogo pins shown in FIG. 12) together. In addition, the coupler 308 includes a pin holder 410, which retains the pins together with a predefined spacing between the pins. The coupler 308 also includes a cover material 412, which may be any suitable material (e.g., silicone, mylar) that is non-conductive and corrosion resistant and that protects the coupler magnet 400 from the environment (e.g., air, moisture). Additionally, the coupler 308 includes a shell 414, which acts as a housing for the coupler 308 to house the components of the coupler 308.

Although the illustrated examples show magnets in both the coupler 308 and the connector subassembly 128, some implementations may include a single magnet. For example, the coupler 308 may include a ferromagnetic part (e.g., magnetizable metal) in lieu of the coupler magnet 400, where the ferromagnetic part is attracted to the connector magnet 402 in the connector subassembly 128 to magnetically retain the coupler 308 to the connector subassembly 128. In another example, the connector subassembly 128 may include a ferromagnetic part (e.g., magnetizable metal) in lieu of the connector magnet 402, where the ferromagnetic part in the connector subassembly 128 is magnetically attracted to the coupler magnet 400 in the coupler 308 to magnetically retain the coupler 308 to the connector subassembly 128.

FIG. 5 illustrates an example implementation of the electronic device in FIG. 1 being coupled to a mounting device. The electronic device 100 is illustrated in an unmounted state 500-1 and in a mounted state 500-2. The electronic device 100 is configured to magnetically couple with a mounting device 502, which avoids the need for mechanical fasteners that require additional components, manufacturing costs, and additional user interaction. Instead, the user can place the electronic device 100 on the mounting device 502 such that the convexly curved exterior surface 504 of the first end 104 abuts a mounting surface 506 of the mounting device 502. A magnet disposed within the mounting device 502 (e.g., behind the mounting surface 506) provides a magnetic force that attracts the rear chassis 124 inside the housing 108 of the electronic device 100 and magnetically retains the electronic device 100 in a mounted state on the mounting device 502. Because the rounded end of the electronic device 100 is mounted magnetically to the mounting device 502, the electronic device 100 can pivotally move relative to the mounting device 502 such that the exterior surface (e.g., convexly curved exterior surface 506) of the rounded end slidably moves against the mounting surface 506 of the mounting device 502.

Figure 6:
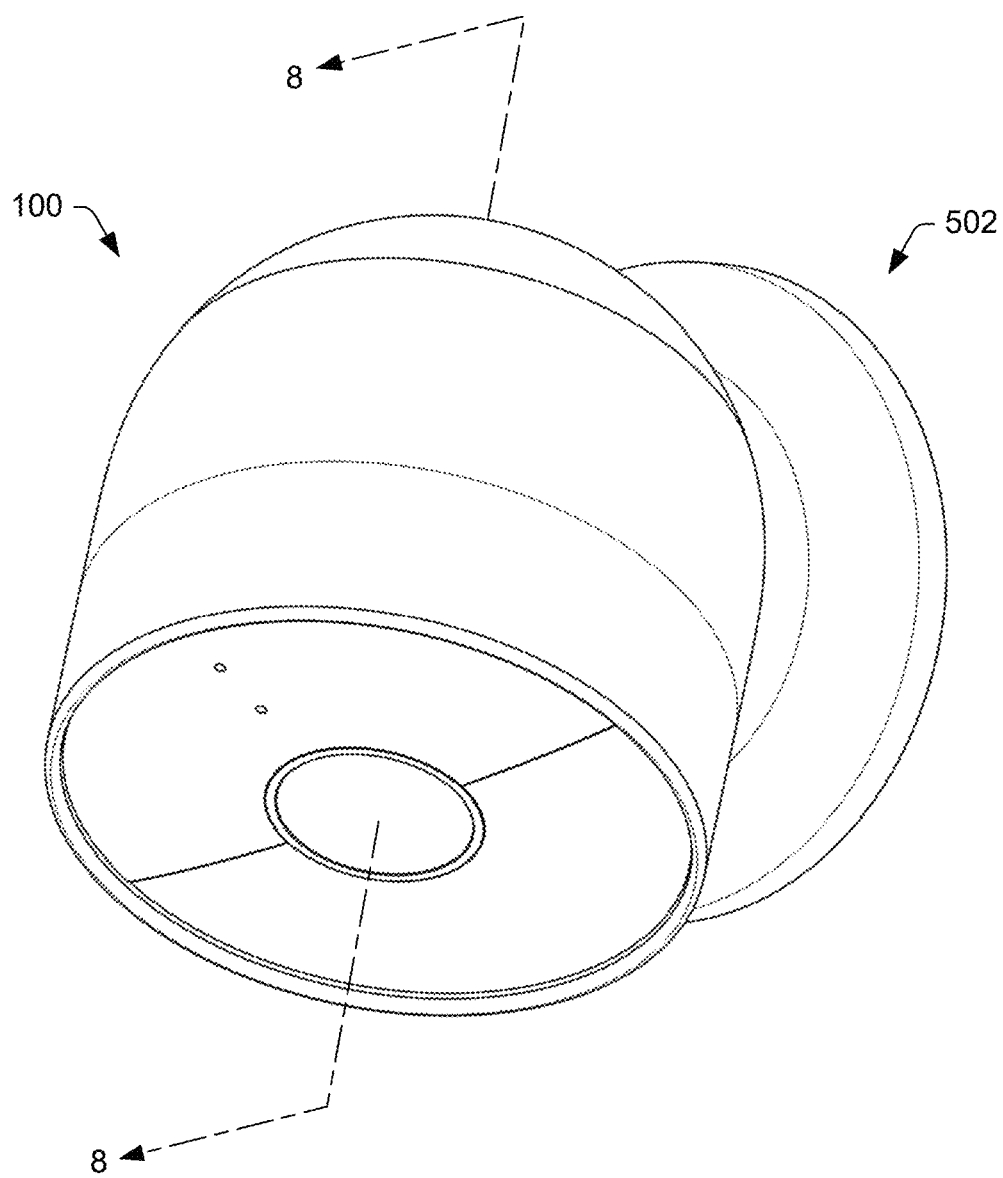
FIG. 6 illustrates an isometric view of the electronic device in FIG. 1 coupled to a mounting device and tilted downward.

FIG. 6 illustrates an isometric view of the electronic device in FIG. 1 coupled to a mounting device and tilted downward. In the illustrated example, the electronic device 100 is tilted downward relative to the mounting device 502.

Figure 7:
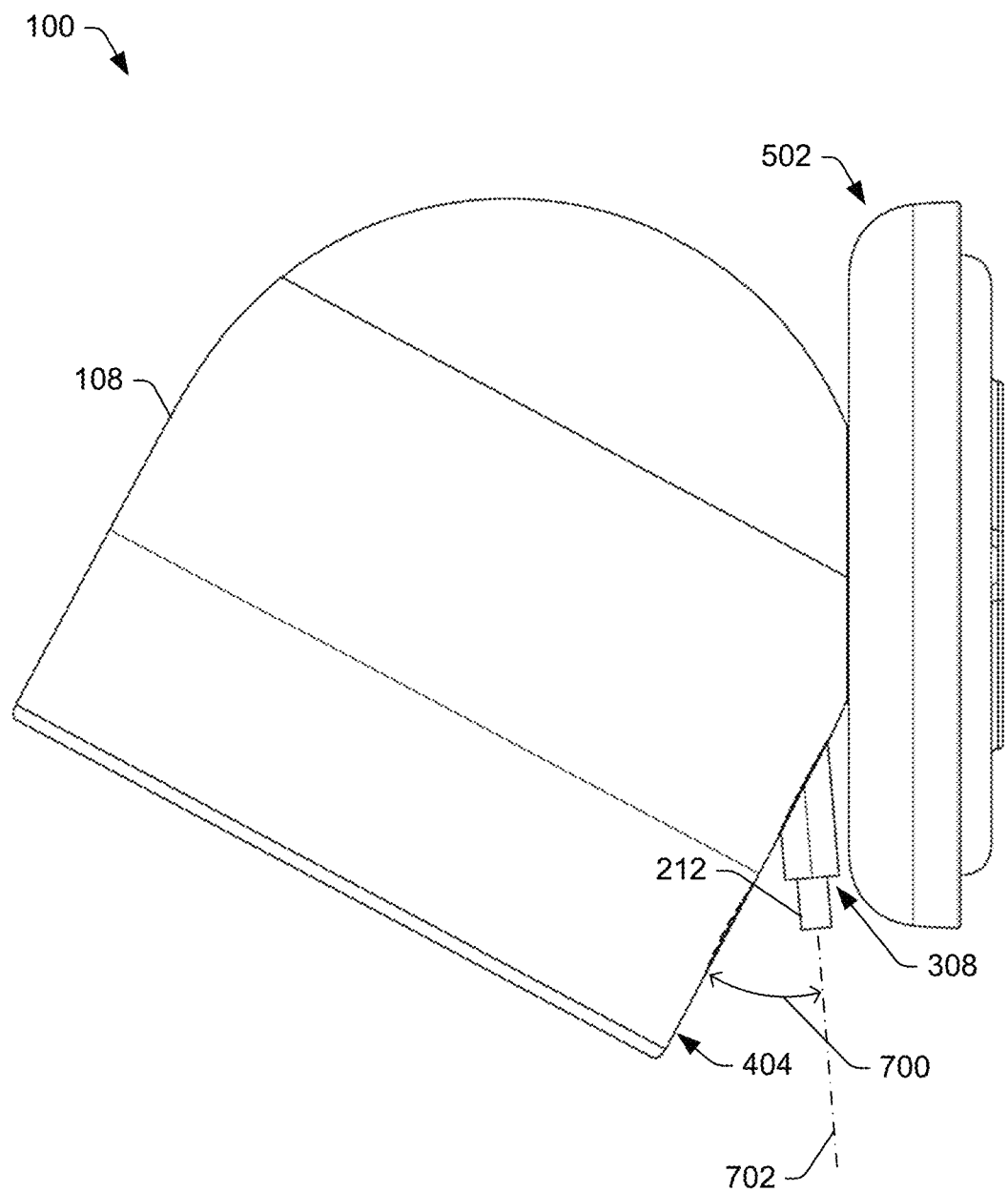
FIG. 7 illustrates a right elevational view of the electronic device in FIG. 6, which is coupled to a mounting device.

FIG. 7 illustrates a right elevational view of the electronic device in FIG. 6, which is coupled to a mounting device. The coupler 308 defines an acute angle 700 directed toward the front (e.g., the front element 110) of the electronic device 100, where the acute angle 700 is defined between a longitudinal axis 702 of a portion of the cable 212 connected to the coupler 308 and the lateral-side exterior surface 404 of the housing 108 proximate to the cable 212. When the electronic device 100 is tilted downward relative to the mounting device 502, the coupler 308 enables a greater downward tilt of the electronic device 100 relative to the mounting device 502 based on the acute angle 700. For example, a larger angle between the cable 212 and the lateral-side exterior surface 404 of the electronic device 100 would result in the cable 212 or the coupler 308 contacting the mounting device 502 and reducing the amount of downward tilt by the electronic device 100.

In aspects, the acute angle 700 is substantially within a range of 15 degrees to 30 degrees, including 25 degrees. The acute angle 700 of the coupler 308 provides an increased range of tilt for the electronic device 100 relative to the mounting device 502 in comparison to conventional camera devices that define an orthogonal angle between the cable and the external surface of the housing. The coupler 308 is connected to the electronic device 100 on the bottom side of the electronic device 100 to reduce the likelihood of water ingress in an outdoor environment.

Figure 8:
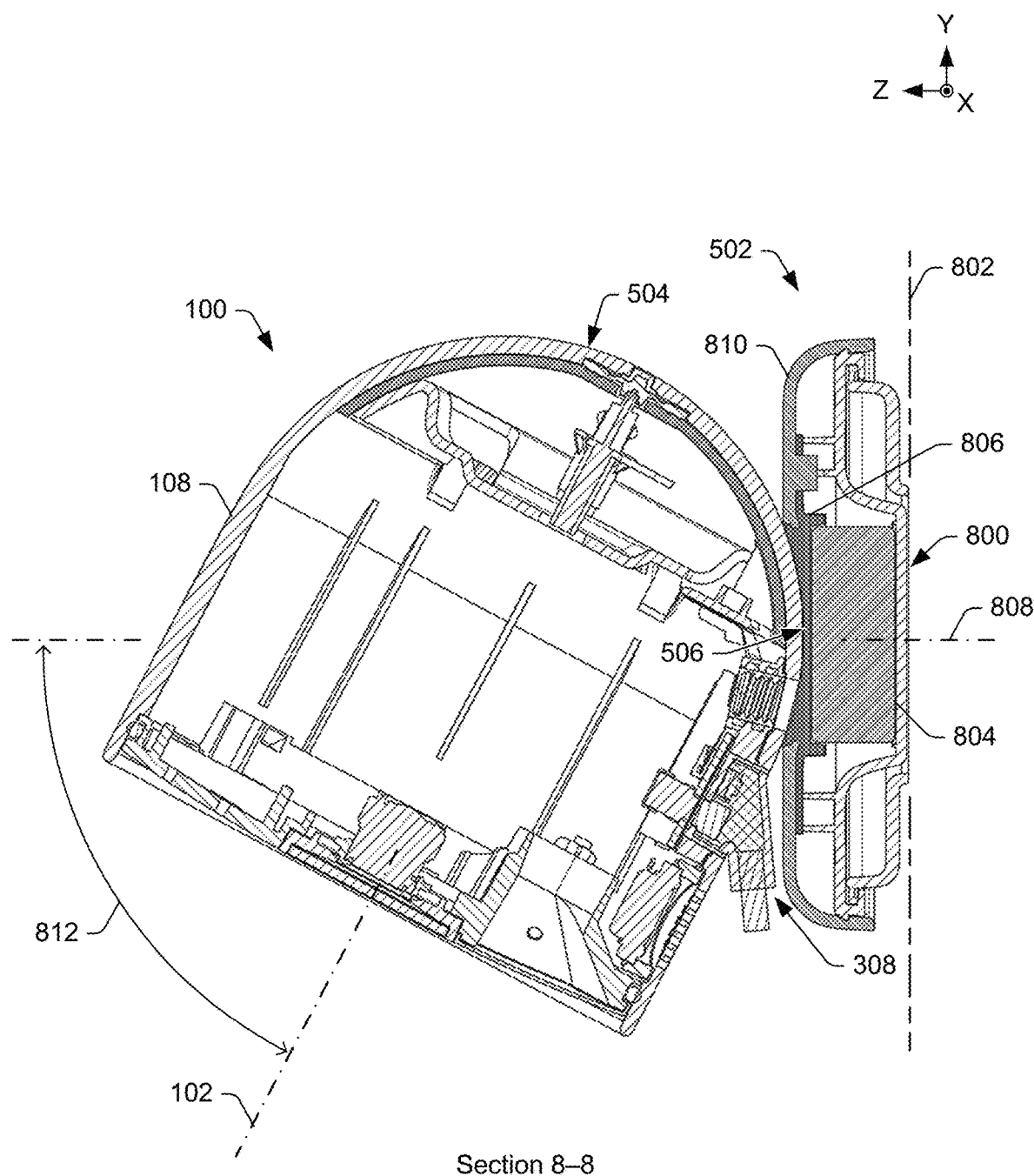
FIG. 8 illustrates a sectional view of the electronic device in FIG. 6, taken along line 8-8.

FIG. 8 illustrates a sectional view of the electronic device in FIG. 6, taken along line 8-8. In the illustrated example, the mounting device 502 includes a backside surface 800 that defines a plane 802 (e.g., xy-plane represented by dashed line) and is configured to be affixed to a surface (e.g., a wall, a table, an inclined surface). The mounting device 502 includes a magnet 804 aligned with a mounting support 806 having the mounting surface 506. Further, the magnet 804 and the mounting support 806 are axially aligned in that they share a common axis (e.g., center axis 808).

Due to the architecture of the electronic device 100 coupled with the mounting device 502, the electronic device 100 can pivotally rotate about a pivot point that is located within the housing 108. To pivotally move in this manner, the convexly curved exterior surface 504 slidably moves across the mounting surface 506, which is a concave surface substantially matching the curvature of the convexly curved exterior surface 504 of the housing 108. When a user tilts the electronic device 100 downward relative to the mounting device 502, the coupler 308 attached to the electronic device 100 is moved with the electronic device 100 and approaches the surface of a front cover 810 of the mounting device 502. As mentioned, because the coupler 308 is angled toward the front (e.g., first end 104) of the electronic device 100, a downward tilt angle 812 (e.g., angle between the longitudinal axis 102 of the electronic device 100 and the center axis 808 of the mounting device 502) of the electronic device 100 is increased over conventional camera devices that have a cable connector forming an approximate orthogonal angle with the camera housing. Accordingly, the downward tilt angle 812 may be up to approximately 60 degrees. This increased downward tilt angle 812 enables the electronic device 100 to have a downward viewing angle sufficient to view the ground proximate to the wall upon which the mounting device 502 is affixed, regardless of a height at which the electronic device 100 is mounted to the wall. In this way, the maximum downward viewing angle does not change based on the height of the electronic device 100. In an example, regardless of whether the electronic device 100 is mounted at six feet (1.829 meters) or 16 feet (4.877 meters), the electronic device 100 can capture an image of a package located on the ground below the electronic device 100 that is at least 6.5 inches (0.165 meters) from the wall.

Figure 9A:
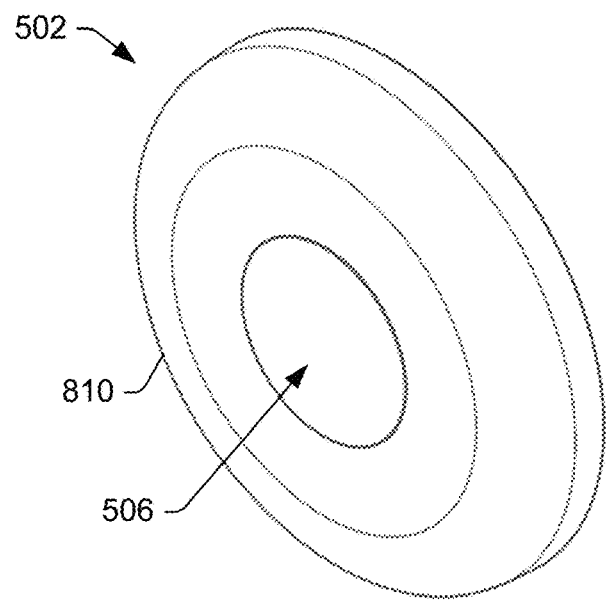
FIG. 9A is a right front perspective view of a mounting device in accordance with some implementations.
Figure 9B:
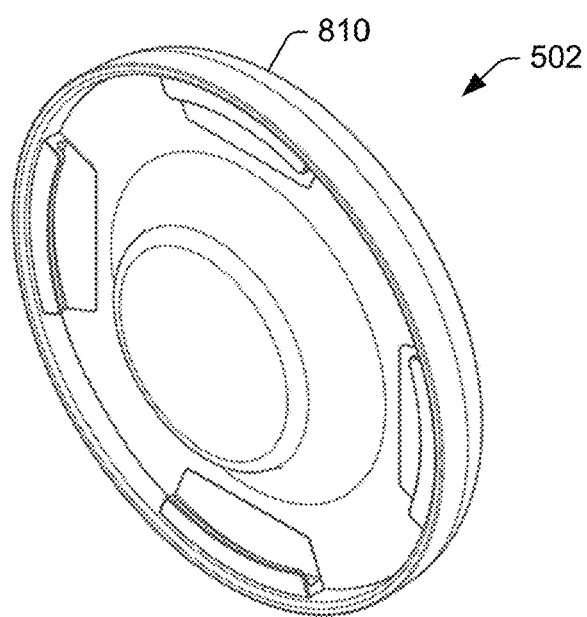
FIG. 9B is a left rear perspective view of the mounting device from FIG. 9A in accordance with some implementations.

FIG. 9A is a right front perspective view of a mounting device in accordance with some implementations. FIG. 9B is a left rear perspective view of the mounting device from FIG. 8A in accordance with some implementations. The mounting device 502 includes the front cover 810 and the mounting surface 506. The mounting surface 506 may be flexible and concave to receive a portion of the continuously convexly curved exterior surface 504 (shown in FIG. 8) of the electronic device 100 in FIGS. 1 through 8.

Figure 10:
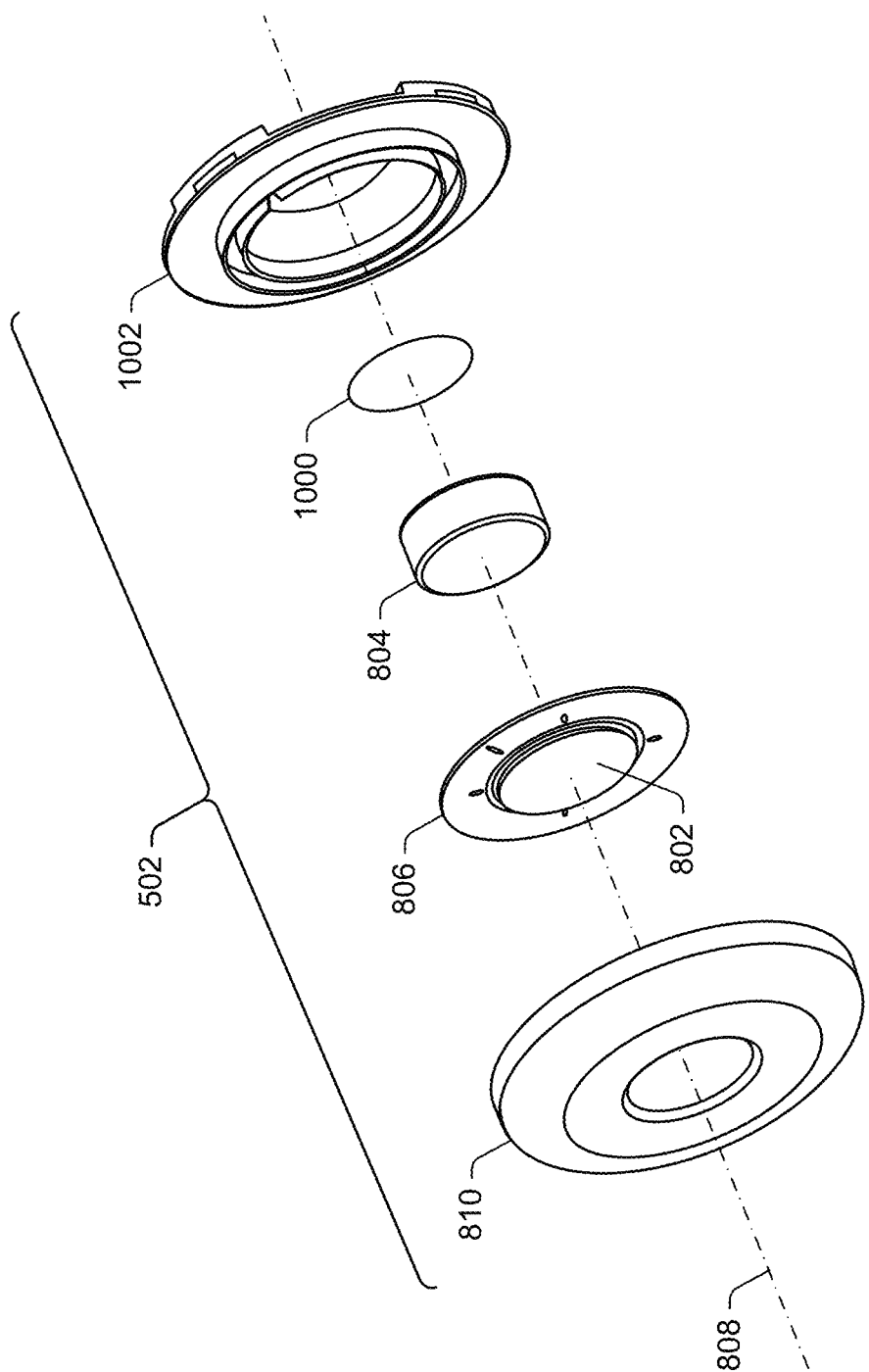
FIG. 10 is an exploded view of the mounting device from FIG. 9A in accordance with some implementations.

Continuing, FIG. 10 is an exploded view of the mounting device from FIG. 9A in accordance with some implementations. In the illustrated example, the mounting device 502 includes the front cover 810, the mounting support 806 having the mounting surface 506, the magnet 804, adhesive 1000, and a rear support 1002. In some aspects, the front cover 810, the mounting support 806, the magnet 804, and the rear support 1002 are coaxially aligned in that they share a common axis (e.g., the center axis 808). Further, the front cover 810 and the mounting support 806 each have a disk-like shape centered around the center axis 808. The mounting surface 506 of the mounting support 806 has a generally circular perimeter. Further, the mounting surface 506 is a flexible material to provide a cushion between the electronic device 100 and the magnet 804 and to absorb impact forces when the electronic device 100 is being mounted to the mounting device 502. The magnet 804, the adhesive 1000, and the rear support 1002 may have any suitable shape and size sufficient to be housed within, or be covered by, the front cover 810.

Figure 11:
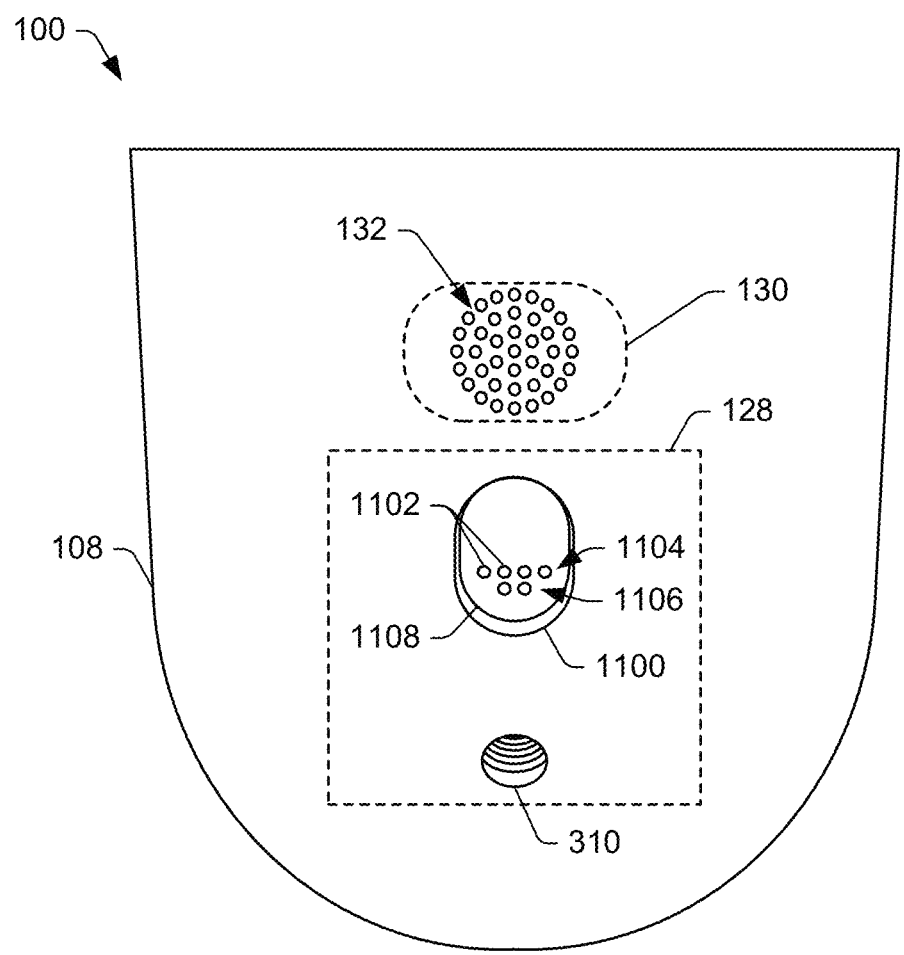
FIG. 11 is a bottom plan view of the electronic device from FIG. 1 in accordance with some implementations.

FIG. 11 is a bottom plan view of the electronic device from FIG. 1 in accordance with some implementations. In the illustrated example, the electronic device 100 includes the threaded insert 310 for mechanically attaching the electronic device 100 to a mounting structure (e.g., tripod, tabletop stand). In addition, the perforations 132 are included and are aligned with a speaker (e.g., speaker module 130 in FIG. 3) disposed within the housing 108 of the electronic device 100. The perforations 132 enable passage of audio waves generated by the speaker module 130. The housing 108 also defines an aperture 1100 that provides access to an input/output (I/O) port, which is part of the connector subassembly 128 shown in FIG. 1-2. The connector subassembly 128 includes a plurality of contacts 1102 that are exposed to air and are configured to contact one or more conductive pins on the coupler 308 (not shown in FIG. 11). In aspects, the contacts 1102 are part of (e.g., printed on) a printed circuit board (PCB) located on the connector subassembly 128 inside the housing 108. These exposed contacts (e.g., the contacts 1102) of the PCB reduce the distance between the PCB and the conductive pins on the coupler 308, which reduces losses associated with electrical resistance in the materials. The contacts 1102 may include any suitable conductive and corrosion-resistant material, including gold or a gold alloy. Also, any suitable number of individual and separate contacts 1102 may be implemented (e.g., 2, 3, 4, 5, 6, 7, 8, and so forth) in any suitable pattern or distribution. In the example shown, the contacts 1102 are arranged in two subsets (e.g., rows). A first subset 1104 of the contacts 1102 may include four contacts in a first row and a second subset 1106 of the contacts may include two contacts in a second row.

In an implementation, the four contacts in the first row may be used to perform USB negotiation and can detect what level of charge the electronic device needs. The two additional contacts in the second row may be used for accessory detection. For example, different accessory devices (e.g., wall mount, floodlight, tabletop mount) may have different resistor values, which can be used by the electronic device 100 to determine information corresponding to the connected accessory device. In this way, the electronic device may perform automatic setup for a particular accessory device rather than requiring the end user to do the setup.

If, for instance, a third party solar panel is electrically connected to electronic device 100, the electronic device 100 may detect a first resistor value, identify the solar panel based on the first resistor value being associated with the solar panel, and then adjust a function, including a function associated with power consumption due to a determination that the electronic device 100 is not receiving constant power but is receiving some power. In another example, the electronic device 100 may detect a second resistor value, which is associated with a table stand, identify the table stand based on the second resistor value, and adjust a function based on the connection to the table stand. In yet another example, the electronic device 100 may detect a third resistor value, which is associated with a wall mount (e.g., mounting device 502), identify the wall mount based on the third resistor value, and adjust a function based on the connection to the wall mount. Such a function for any of the described examples may include activating the camera module, adjusting (e.g., increasing or decreasing) a brightness of one or more LEDs, adjusting (e.g., increasing or decreasing) a time between motion detection operations, increasing a length of a video clip recording to enable additional recordings if additional power is available for consumption, decreasing the length of the video clip recording to conserve power, and so forth.

In addition, the electronic device 100 includes a layer of non-conductive material 1108 (e.g., mylar) located at the bottom of a recessed area accessed through the aperture 1100. The layer of non-conductive material 1108 surrounds each of the contacts 1102 and provides a protective layer for the connector subassembly 128.

Figure 12:
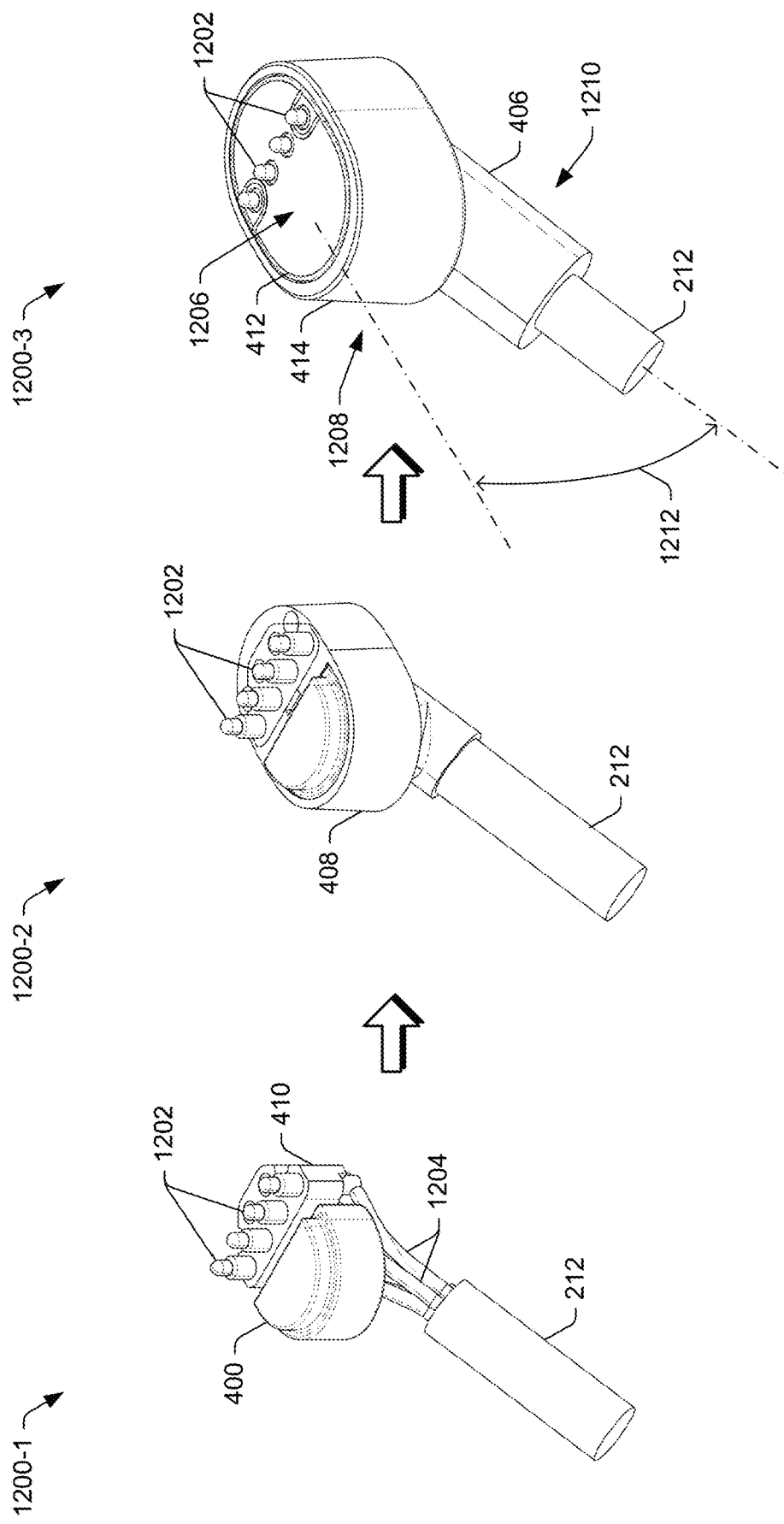
FIG. 12 illustrates right front perspective views of the coupler from FIG. 3 in different states of assembly.
Figure 13:
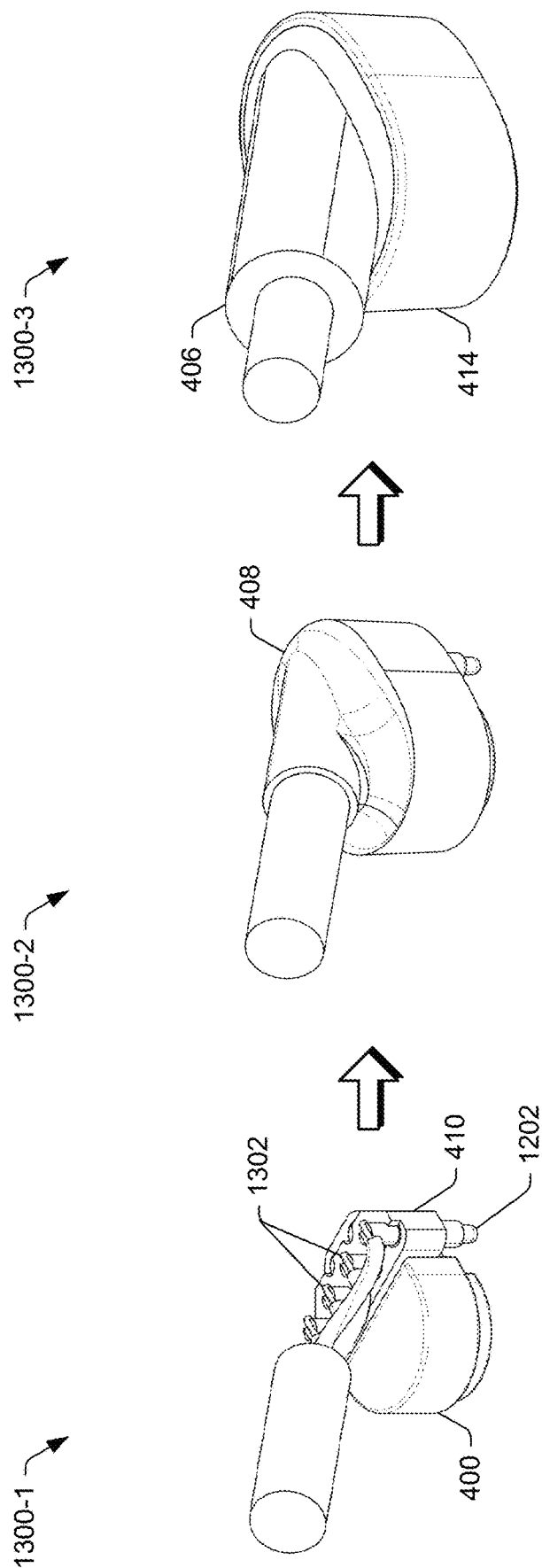
FIG. 13 illustrates left rear perspective views of the coupler in FIG. 12 in different states of assembly.

FIG. 12 illustrates right front perspective views (e.g., views 1200-1, 1200-2, and 1200-3) of the coupler from FIG. 2 in different states of assembly. FIG. 13 illustrates left rear perspective views (e.g., views 1300-1, 1300-2, and 1300-3) of the coupler in FIG. 12 in the different states of assembly. The coupler 308 includes a plurality of pins 1202 (e.g., pogo pins) configured to directly abut the contacts (e.g., contacts 1102 in FIG. 11) of the connector subassembly 128. In FIG. 12, the coupler 308 is illustrated as having four pogo pins (e.g., pins 1202), which may be used, for example, for ground, a bus voltage, and a differential pair. However, any suitable number of pins 1202 may be implemented to supply power and/or transfer signals and data. As shown in view 1200-1, the coupler 308 includes a holder (e.g., the pin holder 410) configured to retain the pins 1202 together with a predefined spacing between the pins 1202. Further, the coupler magnet 400 is disposed proximate to the pin holder 410 to provide a magnetic coupling with the electronic device 100 sufficient to cause the pins 1202 to maintain contact with the contacts 1102 on the connector subassembly 128. As described, the coupler 308 is configured to connect wires 1204 of the cable 212 to the electronic device 100, in particular to the connector subassembly 128 within the electronic device 100.

As shown in view 1200-2, the coupler 308 includes an undermold (e.g., the undermold 408), which holds the pins 1202, the pin holder 410, and the coupler magnet 400 together. As shown in view 1200-3, the coupler 308 includes an overmold (e.g., the overmold 406), which provides strain relief to the cable 212. In aspects, the overmold 406 is a cosmetic part and is exposed to the surrounding environment. In addition, the cover material 412 of the coupler 308 forms a contact surface 1206, which is substantially planar. In aspects, the cover material 412 covers the coupler magnet 400 and includes holes through which the pins 1202 extend. The cover material 412 is non-conductive and may provide a corrosion-resistant layer to protect the coupler magnet 400 from the environment (e.g., air and moisture).

The coupler 308 also includes a shell (e.g., the shell 414) that houses, at least partially, the coupler magnet 400, the pins 1202, the pin holder 410, the undermold 408, and a portion of the overmold 406. In aspects, the coupler 308 includes a head portion 1208 and a tail portion 1210. The head portion 1208 includes the shell 414 and the components housed within the shell 414. The tail portion 1210 includes a portion of the overmold 406 that covers a portion of the cable 212 and creates an acute angle (e.g., the acute angle 700 described in FIG. 7) with respect to the contact surface 1206 of the cover material 412. For example, the tail portion 1210 may form an angle 1212 between the cable 212 and a plane defined by the contact surface 1206 of the head portion 1208. In aspects, the coupler 308 is sized to fit through a 0.5 inch (0.0127 m) hole, which is a common size for a large drill bit owned by users.

In view 1300-1 of FIG. 13, the pins 1202 are connected to the wires 1204 of the cable 212 at connections 1302 and are configured for a USB connection. The view 1300-2 illustrates the undermold 408, which covers the connections 1302 along with the magnet 804 and the pin holder 410. The view 1300-3 illustrates the overmold 406 and the shell 414.

Figure 14:
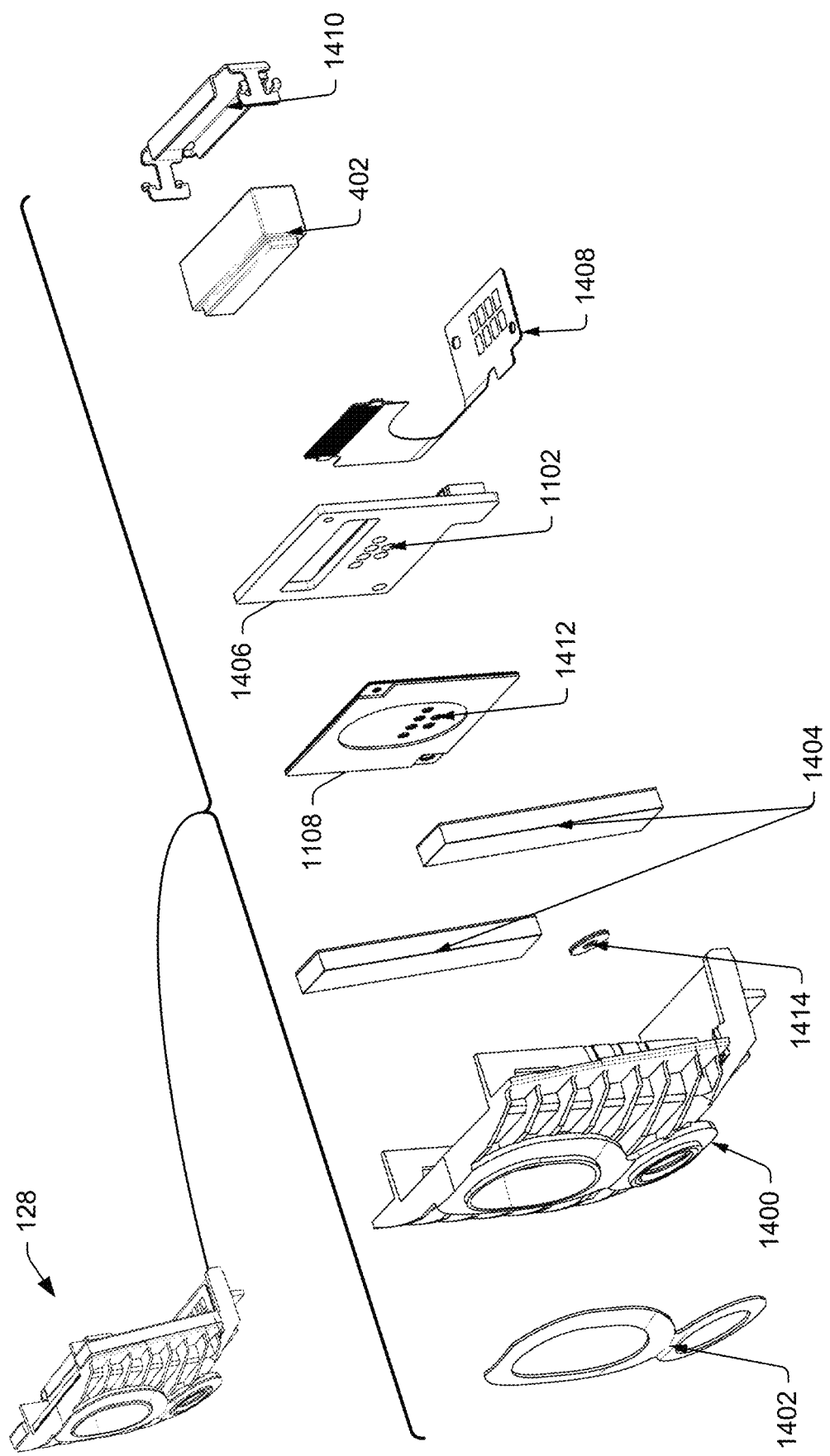
FIG. 14 illustrates a perspective view of a connector subassembly and an exploded view of some components thereof.

FIG. 14 illustrates a perspective view of a connector subassembly and an exploded view of some components thereof. In the illustrated example, the connector subassembly 128 includes a body 1400 forming a rigid structure on which other components of the connector subassembly 128 are attached. The connector subassembly 128 also includes an adhesive 1402, one or more wedges 1404, the sheet of non-conductive material 1108 (e.g., mylar), a printed circuit board assembly (PCBA) 1406, an FPC 1408, the connector magnet 402, and a bracket 1410.

The adhesive 1402 secures the body 1400 to an interior surface of the housing 108 (shown in FIGS. 6 and 11) and provides a water seal around one or more holes in the housing 108 (e.g., the aperture 1100 and a hole aligned with the threaded insert 310). The wedges 1404 are located on opposing sides of the body 1400. Also, the wedges 1404 are disposed on opposing sides of the connector magnet 402. In aspects, the wedges 1404 are oriented in a lengthwise direction that is substantially orthogonal to a lengthwise direction of the connector magnet 402. When the electronic device 100 is assembled, the wedges 1404 receive a compression force from one or more internal components of the electronic device 100 that biases the wedges 1404 against flanges on the body 1400 and in turn biases the body 1400 against the interior surface of the housing 108 of the electronic device 100.

The sheet of non-conductive material 1108 protects the PCBA 1406 from debris and water ingress. The non-conductive material 1108 includes a set of holes 1412 that are aligned with the contacts 1102 on the PCBA 1406. In this way, the contacts 1102 are exposed to air via the holes 1412 in the non-conductive material 1108. The FPC 1408 is connected to the PCBA 1406 on an opposing side of the PCBA 1406 from the contacts 1102. The FPC 1408 electrically connects the PCBA 1406 to the MLB 118 of the electronic device 100. The connector magnet 402 is secured against the body 1400 by the bracket 1410. In aspects, the sheet of non-conductive material 1108 is disposed between the body 1400 and the connector magnet 402 to protect the connector magnet 402 from debris and moisture. In addition, the connector subassembly 128 may include a membrane 1414 positioned proximate to a venting hole (not shown in FIG. 14).

Figure 15A:
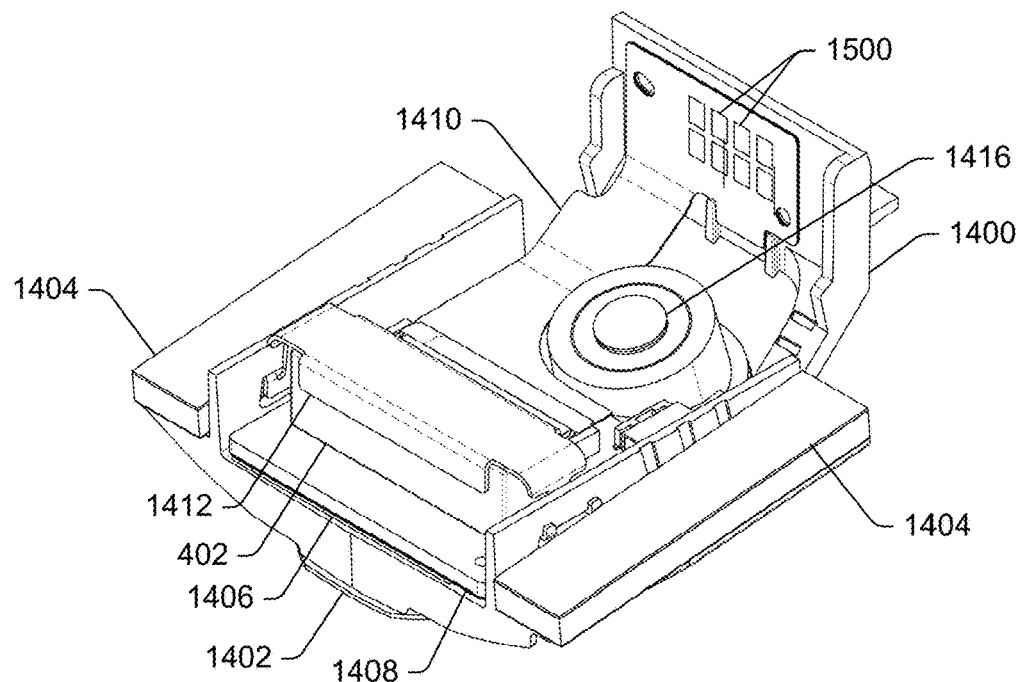
FIG. 15A illustrates a top right perspective view of the connector subassembly in FIG. 14.
Figure 15B:
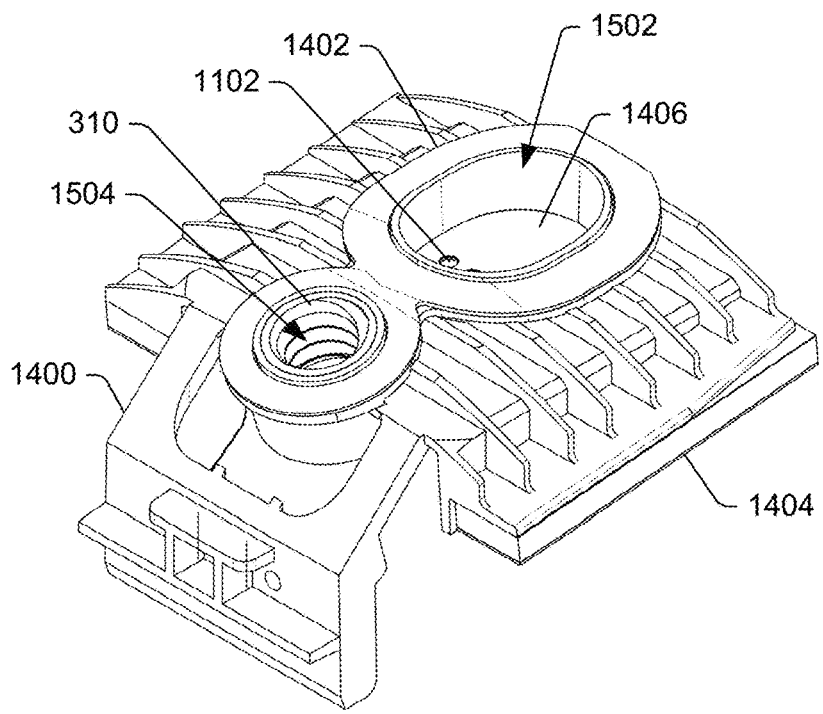
FIG. 15B illustrates a bottom left perspective view of the connector subassembly in FIG. 15A.
Figure 16:
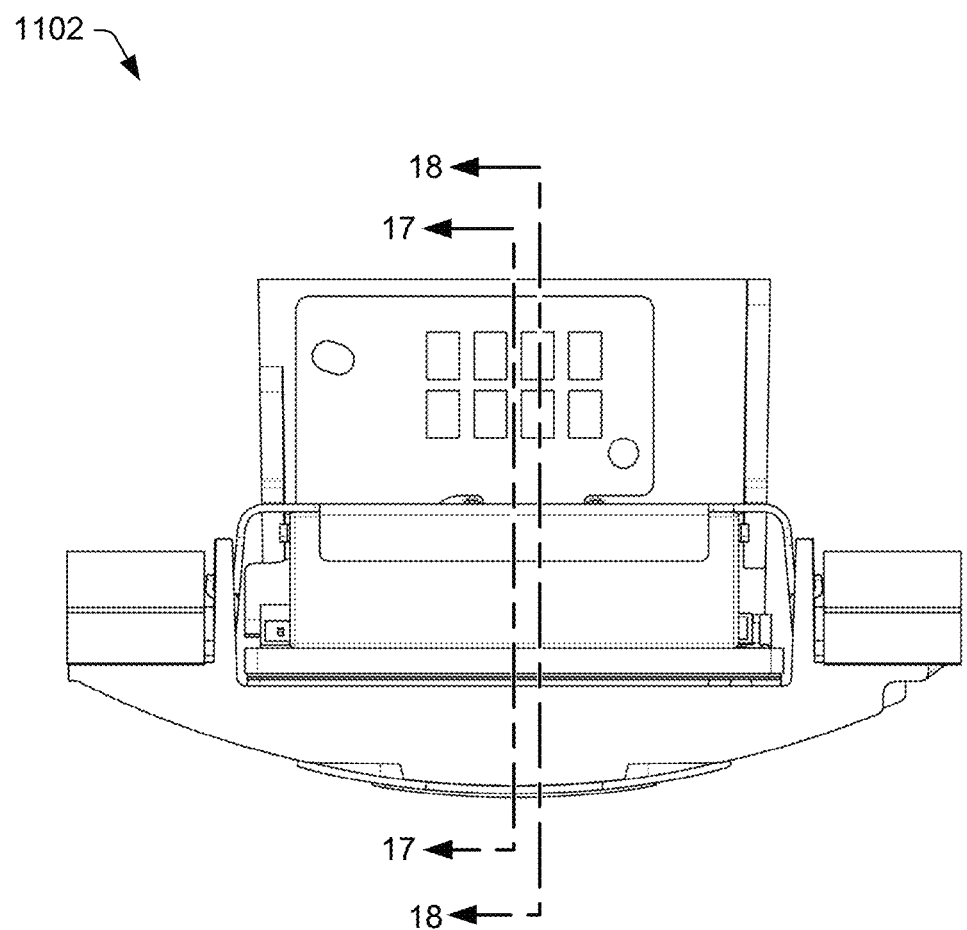
FIG. 16 illustrates a front elevational view of the connector subassembly in FIG. 15A.
Figure 17:
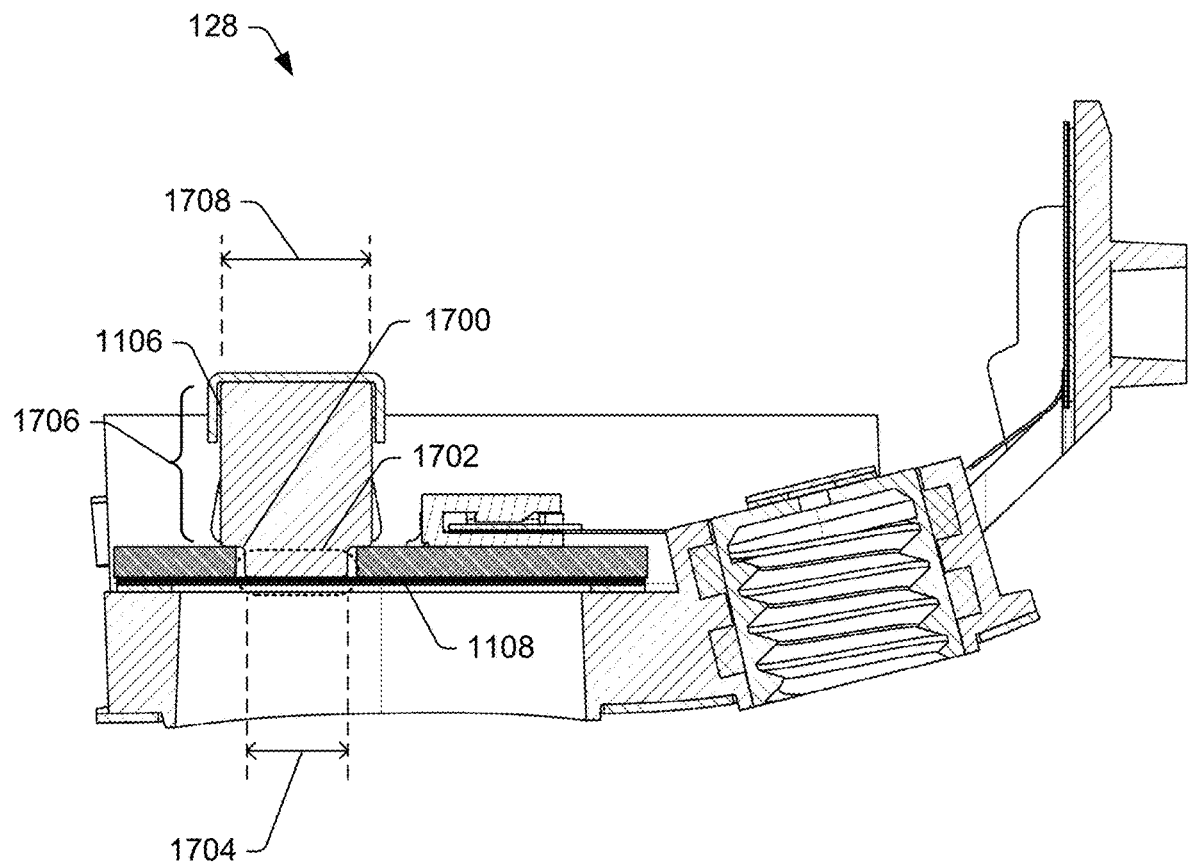
FIG. 17 illustrates a sectional view of the connector subassembly in FIG. 16, taken along line 17-17.
Figure 18:
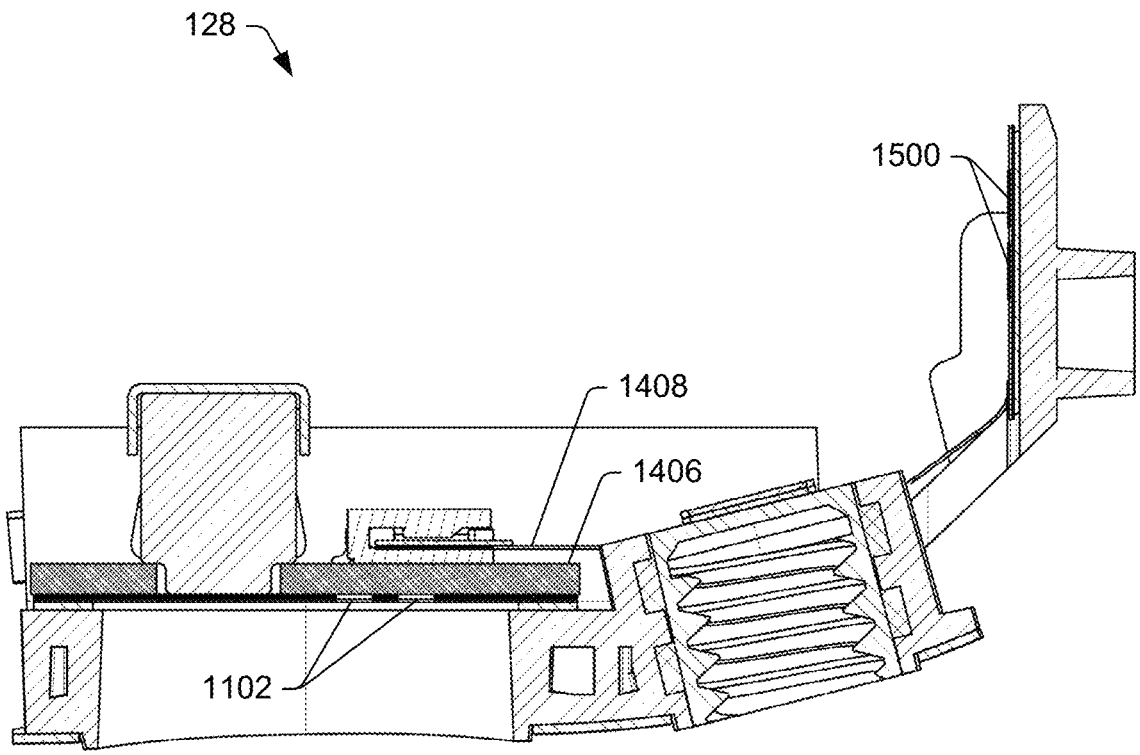
FIG. 18 illustrates a sectional view of the connector subassembly in FIG. 16, taken along line 18-18.

FIG. 15A through FIG. 18 illustrate different views of the connector subassembly 1102 in FIGS. 11 and 15. In particular, FIG. 15A illustrates a top right perspective view of the connector subassembly in FIG. 14. FIG. 15B illustrates a bottom left perspective view of the connector subassembly in FIG. 15A. FIG. 16 is a front elevational view of the connector subassembly in FIG. 14. FIG. 17 is a sectional view of the connector subassembly in FIG. 16, taken along line 17-17. FIG. 18 is a sectional view of the connector subassembly in FIG. 16, taken along line 18-18.

As illustrated in FIG. 15A, the FPC 1408 includes an array 1500 of pins configured to connect to spring contacts on the MLB 118 of the electronic device 100. In the illustrated example, the array 1500 of pins includes eight pins, which are orthogonal to the contacts 1102. The array 1500 may include pins for ground, a bus voltage, a differential pair for USB negotiation, and two additional ground pins. However, any suitable number of pins may be implemented in the array 1500.

As illustrated in FIG. 15B, the connector subassembly 128 defines a first recessed area (e.g., first recess 1502) and a second recessed area (e.g., second recess 1504). The first recess 1502 provides access to an I/O port of the connector subassembly 128, which is configured to receive the coupler 308 and enable the pins 1202 on the coupler 308 (shown in FIG. 13) to physically connect with the contacts 1102 on the connector subassembly 128. The second recess 1504 includes the threaded insert 310, which is usable to attach the electronic device 100 to a support structure (e.g., stand, tripod). The second recess 1504 also includes a venting hole at the bottom of the second recess 1504 to act as an air vent to mitigate pressurization of the interior of the electronic device 100. The membrane 1416 shown in FIG. 15A is positioned over the venting hole. For structural support, the wedges 1404 are each positioned lengthwise in a direction substantially aligned with a line intersecting the centers of the first recess 1502 and the second recess 1504.

FIG. 16 illustrates a front elevational view of the connector subassembly in FIG. 15A. FIG. 17 illustrates a sectional view of the connector subassembly in FIG. 16, taken along line 17-17. FIG. 18 illustrates a sectional view of the connector subassembly in FIG. 16, taken along line 18-18.

As illustrated in the sectional view of FIG. 17, the body 1400 of the connector subassembly 128 has a general L-shaped cross section. The connector magnet 402 is illustrated with a cross section that is substantially rectangular with at least one recessed edge 1700 providing a first portion 1702 of the connector magnet 402 having a first width 1704 and a second portion 1706 of the connector magnet 402 having a second width 1708 that is greater than the first width 1704 of the first portion 1702. The first portion 1702 of the connector magnet 402 is positioned within an aperture (e.g., cutout) in the PCBA 1406 to reduce a distance between the connector magnet 402 and the coupler magnet 400 of the coupler 308 (shown in FIG. 13) when the coupler 308 is coupled to the connector subassembly 128. Accordingly, the distance between the connector magnet 402 and the coupler magnet 400 is approximately equal to a thickness of the non-conductive material 1108 combined with a thickness of the cover material 412 of the coupler 308 (shown in FIGS. 4 and 12).

The sectional view of FIG. 18 is taken along line 18-18 of FIG. 16, which intersects two of the pins in the array 1500 of pins on the PCBA 1406. Accordingly, when the pins (e.g., pins 1202 in FIG. 12) of the coupler 308 touch the contacts 1102, electrical signals can be transmitted through the PCBA 1406 to the FPC 1408 and then to the MLB (e.g., the MLB 118 in FIG. 1-2) of the electronic device 100. By implementing the contacts 1102 directly onto the PCBA 1406, the distance between the pins and the PCBA 1406 is reduced, which also reduces losses associated with resistances of materials through which the signals travel. The distance between the pins on the coupler 308 and the PCBA 1406 is equal to the thicknesses of the contacts 1102. Further, the contacts 1102 are orthogonal to the array 1500 of pins, which may reduce signal interference between the contacts 1102 and the array 1500 of pins.

Example Computing System

Figure 19:
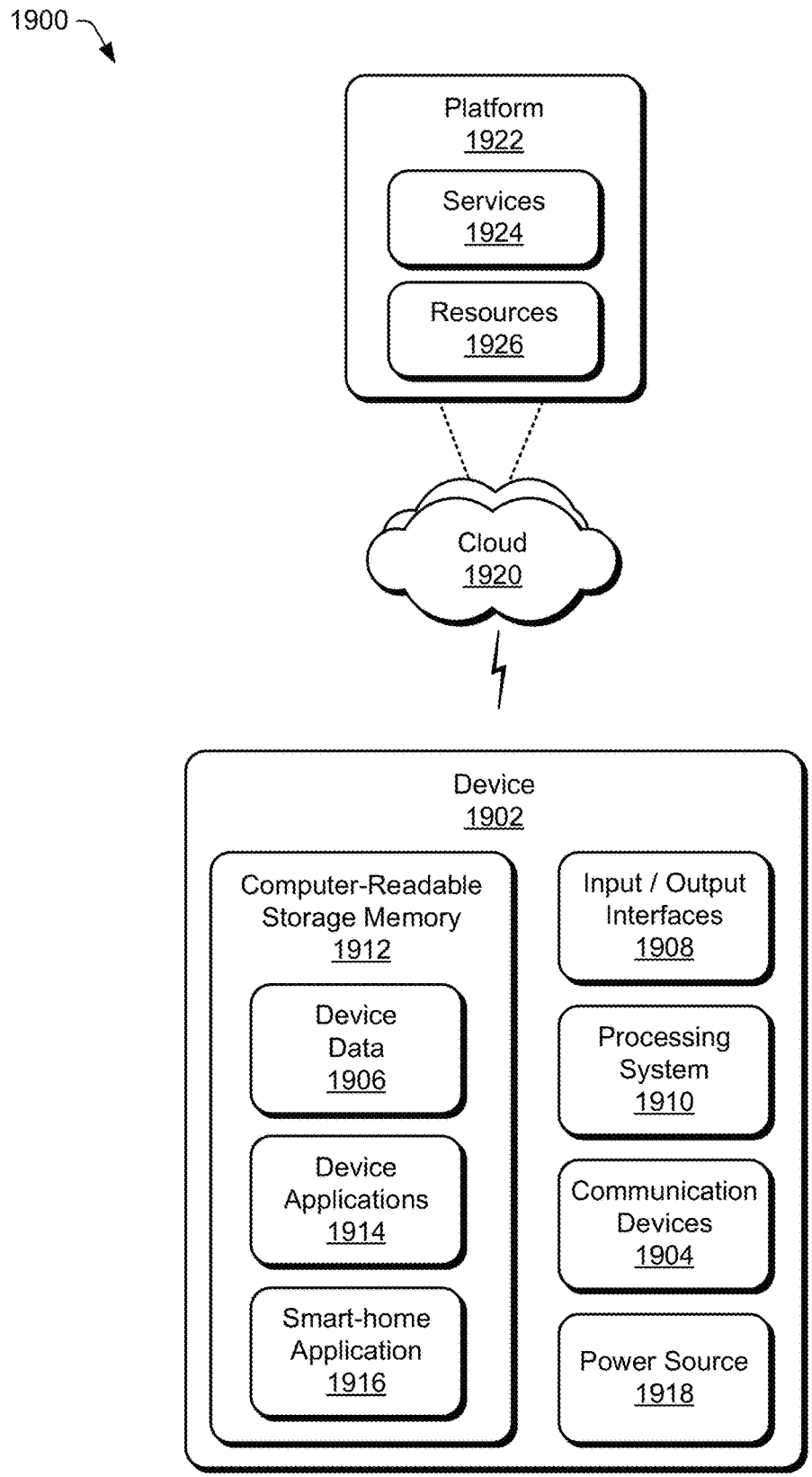
FIG. 19 is a block diagram illustrating an example system that includes an example device, which can be implemented as any electronic device (e.g., the electronic device in FIG. 1) that implements aspects of a security camera with an angled cable attachment for an increased downward-viewing angle as described with reference to FIGS. 1 to 18.

FIG. 19 is a block diagram illustrating an example system 1900 that includes an example device 1902, which can be implemented as any electronic device (e.g., the electronic device 100 in FIG. 1) that implements aspects of a security camera with an angled cable attachment for an increased downward-viewing angle as described with reference to FIGS. 1 to 18. The example device 1902 may be any type of computing device, client device, mobile phone, tablet, communication, entertainment, gaming, media playback, and/or other type of device. Further, the example device 1902 may be implemented as any other type of electronic device that is configured for communication on a network, such as a thermostat, doorbell, hazard detector, camera, light unit, commissioning device, router, border router, joiner router, joining device, end device, leader, access point, a hub, and/or other electronic devices. The example device 1902 can be integrated with electronic circuitry, microprocessors, memory, input output (I/O) logic control, communication interfaces and components, as well as other hardware, firmware, and/or software to communicate via the network. Further, the device 1902 can be implemented with various components, such as with any number and combination of different components as further described below.

The device 1902 includes communication devices 1904 that enable wired and/or wireless communication of device data 1906, such as data that is communicated between the devices in a network, data that is being received, data scheduled for broadcast, data packets of the data, data that is synched between the devices, etc. The device data can include any type of communication data, as well as audio, video, and/or image data that is generated by applications executing on the device. The communication devices 1904 can also include transceivers for cellular phone communication and/or for network data communication. The communication devices 1904 can include wireless radio systems for multiple, different wireless communications systems. The wireless radio systems may include Wi-Fi, Bluetooth™, Mobile Broadband, Bluetooth Low Energy (BLE), and/or point-to-point IEEE 802.15.4. Each of the different radio systems can include a radio device, antenna, and chipset that is implemented for a particular wireless communications technology.

The device 1902 also includes input/output (I/O) interfaces 1908, such as data network interfaces that provide connection and/or communication links between the device, data networks (e.g., an internal network, external network, etc.), and other devices. The I/O interfaces can be used to couple the device to any type of components, peripherals, and/or accessory devices. The I/O interfaces also include data input ports via which any type of data, media content, and/or inputs can be received, such as user inputs to the device, as well as any type of communication data, such as audio, video, and/or image data received from any content and/or data source.

The device 1902 includes a processing system 1910 that may be implemented at least partially in hardware, such as with any type of microprocessors, controllers, or the like that process executable instructions. The processing system can include components of an integrated circuit, programmable logic device, a logic device formed using one or more semiconductors, and other implementations in silicon and/or hardware, such as a processor and memory system implemented as a system-on-chip (SoC). Alternatively or in addition, the device can be implemented with any one or combination of software, hardware, firmware, or fixed logic circuitry that may be implemented with processing and control circuits. The device 1902 may further include any type of a system bus or other data and command transfer system that couples the various components within the device. A system bus can include any one or combination of different bus structures and architectures, as well as control and data lines.

The device 1902 also includes computer-readable storage memory 1912, such as data storage devices that can be accessed by a computing device, and that provide persistent storage of data and executable instructions (e.g., software applications, modules, programs, functions, or the like). The computer-readable storage memory described herein excludes propagating signals. Examples of computer-readable storage memory include volatile memory and non-volatile memory, fixed and removable media devices, and any suitable memory device or electronic data storage that maintains data for computing device access. The computer-readable storage memory can include various implementations of random access memory (RAM), read-only memory (ROM), flash memory, and other types of storage memory in various memory device configurations.

The computer-readable storage memory 1912 provides storage of the device data 1906 and various device applications 1914, such as an operating system that is maintained as a software application with the computer-readable storage memory and executed by the processing system 1910. The device applications may also include a device manager, such as any form of a control application, software application, signal processing and control module, code that is native to a particular device, a hardware abstraction layer for a particular device, and so on. In this example, the device applications also include a smart-home application 1916 that implements aspects of the security camera with an angled cable attachment, such as when the example device 1902 is implemented as the electronic device 100 described herein. The device 1902 also includes a power source 1918, such as the battery 114. An alternating current (AC) power source may also be used to charge the battery of the device.

In aspects, at least part of the techniques described for the electronic device 100 may be implemented in a distributed system, such as over a "cloud" 1920 in a platform 1922. The cloud 1920 includes and/or is representative of the platform 1922 for services 1924 and/or resources 1926.

The platform 1922 abstracts underlying functionality of hardware, such as server devices (e.g., included in the services 1924) and/or software resources (e.g., included as the resources 1926), and communicatively connects the example device 1902 with other devices, servers, etc. The resources 1926 may also include applications and/or data that can be utilized while computer processing is executed on servers that are remote from the example device 1902. Additionally, the services 1924 and/or the resources 1926 may facilitate subscriber network services, such as over the Internet, a cellular network, or Wi-Fi network. The platform 1922 may also serve to abstract and scale resources to service a demand for the resources 1926 that are implemented via the platform, such as in an interconnected device implementation with functionality distributed throughout the system 1900. For example, the functionality may be implemented in part at the example device 1902 as well as via the platform 1922 that abstracts the functionality of the cloud 1920.

Some examples are provided below:

A system comprising an electronic device comprising: a housing having a generally cup-shaped shell and being generally symmetric about a central axis, the housing having a front end defined by an opening of the shell and a rear end defined by a rounded cap of the shell; a front element positioned at the front end of the housing and oriented to substantially cover the opening of the shell, the front element having a lens cover; a camera module disposed within the housing and aligned with the lens cover of the front element; a magnetizable member positioned within the housing proximate to the rear end of the housing, the magnetizable member configured to magnetically couple the electronic device to a mounting device; and a recessed area located on a lateral side of the housing and including a substantially planar surface and a plurality of contacts that are conductive and exposed through the substantially planar surface. The system may further comprise a coupler having a contact surface configured to contact the substantially planar surface, the coupler attached to a cable and configured to removably connect the cable to the electronic device via the recessed area, the coupler configured to define an acute angle between the cable and the contact surface, the coupler causing the cable to extend in a direction toward the front end of the housing to increase a downward tilt angle of the electronic device relative to the mounting device.

The coupler may include a head portion configured to be positioned within the recessed area. The coupler may include a tail portion configured to cause the cable to extend in the direction toward the front end of the housing according to the acute angle.

The coupler may include a coupler magnet positioned within the head portion of the coupler and proximate to the contact surface of the coupler, and the coupler magnet may be configured to magnetically attract a ferromagnetic part disposed within the housing of the electronic device to magnetically secure the coupler to the substantially planar surface of the recessed area.

The ferromagnetic part may be disposed within the housing of the electronic device is a connector magnet.

The ferromagnetic part may be located within the housing of the electronic device is a magnetizable metal.

The connector subassembly may include a connector magnet disposed within the housing and proximate to the substantially planar surface of the recessed area, and the connector magnet may be configured to magnetically attract a ferromagnetic part disposed within the head portion of the coupler to magnetically secure the coupler to the connector subassembly.

The ferromagnetic part may be disposed within the body of the coupler is a magnetizable metal.

The plurality of contacts may include: a first subset of the contacts usable for a universal-serial-bus negotiation; and a second subset of the contacts usable for accessory detection.

The plurality of contacts may be part of a printed circuit board, PCB, that is disposed within the housing.

Each contact of the plurality of contacts may include gold or a gold alloy.

The acute angle may be substantially within a range of 15 and 30 degrees.

The electronic device may further comprise the mounting device. The mounting device may have a center axis. The downward tilt angle may be defined by the central axis of the housing relative to the center axis of the mounting device.

The electronic device may further comprise a camera board disposed within the housing. The camera module may be mounted to the camera board. The electronic device may further comprise a passive infrared, PIR, sensor mounted to the camera board and aligned with a portion of the front element that is proximate to the lens cover and infrared transparent.

The electronic device may further comprise a standoff between the PIR sensor and the camera board. The standoff may be configured to define a sensor-to-lens distance between the PIR sensor and a lens implemented on the portion of the front element that is aligned with the PIR sensor.

The electronic device may further comprise a PIR shield having a generally tubular shape. The PIR shield may be disposed around a base of the PIR sensor, leads of the PIR sensor, and the standoff to provide grounding for sidewalls of the PIR sensor and shielding for the leads of the PIR sensor.

CONCLUSION

Although aspects of the security camera with an angled cable attachment for an increased downward-viewing angle have been described in language specific to features and/or methods, the subject of the appended claims is not necessarily limited to the specific features or methods described. Rather, the specific features and methods are disclosed as example implementations of the claimed security camera with an angled cable attachment for an increased downward-viewing angle, and other equivalent features and methods are intended to be within the scope of the appended claims. Further, various different aspects are described, and it is to be appreciated that each described aspect can be implemented independently or in connection with one or more other described aspects.

What is claimed is:

1. A system comprising:
    an electronic device comprising:
        a housing having a generally cup-shaped shell and being generally symmetric about a central axis, the housing having a front end defined by an opening of the shell and a rear end defined by a rounded cap of the shell;
        a front element positioned at the front end of the housing and oriented to substantially cover the opening of the shell, the front element having a lens cover;
        a camera module disposed within the housing and aligned with the lens cover of the front element;
        a magnetizable member positioned within the housing proximate to the rear end of the housing, the magnetizable member configured to magnetically couple the electronic device to a mounting device; and
        a recessed area located on a lateral side of the housing and including a substantially planar surface and a plurality of contacts that are conductive and exposed through the substantially planar surface; and
    a coupler having a contact surface configured to contact the substantially planar surface, the coupler attached to a cable and configured to removably connect the cable to the electronic device via the recessed area, the coupler configured to define an acute angle between the cable and the contact surface, the coupler causing the cable to extend in a direction toward the front end of the housing to increase a downward tilt angle of the electronic device relative to the mounting device.

2. The system of claim 1, wherein the coupler includes:
    a head portion configured to be positioned within the recessed area; and
    a tail portion configured to cause the cable to extend in the direction toward the front end of the housing according to the acute angle.

3. The system of claim 2, wherein:
    the coupler includes a coupler magnet positioned within the head portion of the coupler and proximate to the contact surface of the coupler; and
    the coupler magnet is configured to magnetically attract a ferromagnetic part disposed within the housing of the electronic device to magnetically secure the coupler to the substantially planar surface of the recessed area.

4. The system of claim 3, wherein the ferromagnetic part disposed within the housing of the electronic device is a connector magnet.

5. The system of claim 3, wherein the ferromagnetic part located within the housing of the electronic device is a magnetizable metal.

6. The system of claim 2, wherein:
    the electronic device includes a connector subassembly disposed within the housing;
    the connector subassembly includes a connector magnet disposed proximate to the substantially planar surface of the recessed area; and
    the connector magnet is configured to magnetically attract a ferromagnetic part disposed within the head portion of the coupler to magnetically secure the coupler to the connector subassembly.

7. The system of claim 6, wherein the ferromagnetic part disposed within the head portion of the coupler is a magnetizable metal.

8. The system of claim 1, wherein the plurality of contacts include:
    a first subset of the contacts usable for a universal-serial-bus negotiation; and
    a second subset of the contacts usable for accessory detection.

9. The system of claim 8, wherein:
    the first subset of the contacts is usable to detect a level of charge for the electronic device; and
    the second subset of the contacts are usable to detect a resistor value and determine information corresponding to a connected accessory based on the resistor value.

10. The system of claim 8, further comprising:
    a processor; and
    a memory system storing instructions that, responsive to execution by the processor, cause the processor to perform operations including:
        identifying a connected accessory based on a resistor value detected via the second set of the contacts; and
        adjusting a function of the electronic device based on identifying the connected accessory.

11. The system of claim 1, wherein the plurality of contacts are part of a printed circuit board that is disposed within the housing.

12. The system of claim 1, wherein each contact of the plurality of contacts includes gold or a gold alloy.

13. The system of claim 1, wherein the acute angle is substantially within a range of 15 and 30 degrees.

14. The system of claim 1, further comprising the mounting device, wherein the mounting device has a center axis, and wherein the downward tilt angle is defined by the central axis of the housing relative to the center axis of the mounting device.

15. The system of claim 1, further comprising:
    a camera board disposed within the housing, wherein the camera module is mounted to the camera board; and
    a passive infrared (PIR) sensor mounted to the camera board and aligned with a portion of the front element that is proximate to the lens cover and infrared transparent.

16. The system of claim 15, further comprising a standoff between the PIR sensor and the camera board, wherein the standoff is configured to define a sensor-to-lens distance between the PIR sensor and a lens implemented on the portion of the front element that is aligned with the PIR sensor.

17. The system of claim 16, further comprising a PIR shield having a generally tubular shape, wherein the PIR shield is disposed around a base of the PIR sensor, leads of the PIR sensor, and the standoff to provide grounding for sidewalls of the PIR sensor and shielding for the leads of the PIR sensor.

18. The system of claim 1, wherein the acute angle is defined between a longitudinal axis of a portion of the cable connected to the coupler and a lateral-side exterior surface of the housing proximate to the cable.

19. The system of claim 1, wherein the acute angle between the cable and the contact surface is defined by the coupler to cause the downward tilt angle to enable the camera module to have a downward viewing angle sufficient to view the ground proximate to a wall upon which the mounting device is affixed.

20. The system of claim 1, wherein the electronic device includes a layer of non-conductive material located on the substantially planar surface of the recessed area, the layer of non-conductive material surrounding one or more contacts of the plurality of contacts.

\* \* \* \* \*